(12) United States Patent
Dao

(10) Patent No.: US 11,863,190 B1
(45) Date of Patent: Jan. 2, 2024

(54) MULTI-BIT FLIP-FLOPS UTILIZING SHARED CLOCK ELEMENTS

(71) Applicant: Steve Dao, Houston, TX (US)

(72) Inventor: Steve Dao, Houston, TX (US)

(*) Notice: Subject to any disclaimer, the term of this patent is extended or adjusted under 35 U.S.C. 154(b) by 0 days.

(21) Appl. No.: 18/091,694

(22) Filed: Dec. 30, 2022

(51) Int. Cl.
H03K 3/356 (2006.01)
H03K 3/037 (2006.01)
H03K 3/012 (2006.01)

(52) U.S. Cl.
CPC ....... H03K 3/356191 (2013.01); H03K 3/012 (2013.01); H03K 3/037 (2013.01)

(58) Field of Classification Search
CPC .. H03K 3/012; H03K 3/037; H03K 3/356182; H03K 3/356191
See application file for complete search history.

(56) References Cited

U.S. PATENT DOCUMENTS

| | | | |
|---|---|---|---|
| 8,604,855 B2 | 12/2013 | Dally et al. | |
| 8,786,345 B2 | 7/2014 | Alben et al. | |
| 8,941,429 B2 | 1/2015 | Cheng | |
| 9,667,230 B1 | 5/2017 | Fojtik et al. | |
| 9,755,623 B2 | 9/2017 | Cheng et al. | |
| 9,891,283 B2 | 2/2018 | Kim et al. | |
| 2013/0147534 A1* | 6/2013 | Cheng | H03K 3/35625 327/202 |
| 2019/0089337 A1* | 3/2019 | Venugopal | H03K 3/35625 |
| 2021/0281250 A1 | 9/2021 | Hsu et al. | |

* cited by examiner

*Primary Examiner* — Patrick O Neill
(74) *Attorney, Agent, or Firm* — Southern Methodist University Dedman School of Law

(57) ABSTRACT

Circuits, methods, and systems for generating data outputs based on sampled data inputs. One circuit includes a first clock-activated transistor electrically coupled to a first shared clock node, a second clock-activated transistor coupled to a second shared clock node, a third clock-activated transistor coupled to a third shared clock node, a plurality of flip-flops, a latch electrically coupled to the second shared clock node and the third shared clock node, and a first keeper sub-circuit electrically coupled to the third shared clock node and at least one of a first output or a second output of the latch. Each flip-flop of the plurality of flip-flops includes a latch electrically coupled to the second shared clock node and the third shared clock node and a first keeper sub-circuit electrically coupled to the third shared clock node and at least one of a first output or a second output of the latch.

20 Claims, 19 Drawing Sheets

MULTI-BIT FLIP-FLOPS UTILIZING SHARED CLOCK ELEMENTS

BACKGROUND

The present disclosure relates generally to the field of integrated circuit technology. In an integrated circuit design such as very large scale integration (VLSI) systems, there can be a plurality of flip-flops including a plurality of transistors.

SUMMARY

Implementations described herein relate to circuits and techniques using a compound sequential circuit a first clock-activated transistor electrically coupled to a first shared clock node, a second clock-activated transistor coupled to a second shared clock node, a third clock-activated transistor coupled to a third shared clock node, and a plurality of flip-flops, wherein each flip-flop of the plurality of flip-flops includes a latch electrically coupled to the second shared clock node and the third shared clock node and a first keeper sub-circuit electrically coupled to the third shared clock node and at least one of a first output or a second output of the latch.

In some implementations, each flip-flop of the plurality of flip-flops further includes a first buffer electrically coupled to the first shared clock node, a second buffer electrically coupled to the first shared clock node, a second keeper sub-circuit electrically coupled to the third shared clock node and the second output of the latch, wherein first keeper sub-circuit is electrically coupled to the first output of the latch, and wherein the first keeper sub-circuit is gated by the first output of the latch and an inverted input signal, and wherein the second keeper sub-circuit is gated by the second output of the latch and an input signal.

In some implementations, each flip-flop of the plurality of flip-flops further includes a first sequence detector including the first buffer and electrically couples to the first output of the latch and to the inverted input signal, wherein the first sequence detector configured to activate a first differential sub-circuit of the latch in response to (1) the first output of the latch being at a second level, (2) the input signal being at a first level, and (3) a main clock signal being at the first level, wherein the first differential sub-circuit of the latch is deactivated when the main clock signal is at the second level, a second sequence detector including the second buffer and electrically couples to the second output of the latch and to the input signal, wherein the second sequence detector configured to activate a second differential sub-circuit of the latch in response to (1) the first output of the latch being at a first level, (2) the input signal being at a second level, and (3) a main clock signal being at the first level, wherein the second differential sub-circuit of the latch is deactivated when the main clock signal is at the second level, wherein the first differential sub-circuit of the latch and second differential sub-circuit of the latch are electrically coupled to the third shared clock node, and wherein the inputs of the first keeper sub-circuit have the same logic polarities compared to the inputs of the first sequence detector, and wherein the inputs of the second keeper sub-circuit have the same logic polarities compared to the inputs of the second sequence detector.

In some implementations, the first keeper sub-circuit is activated in response to (1) the first output of the latch being at the second level, (2) the input signal being at the first level, and (3) a main clock signal being at the second level, wherein the second keeper sub-circuit is activated in response to (1) the first output of the latch being at the first level, (2) the input signal being at the second level, and (3) a main clock signal being at the second level, and wherein both the first keeper sub-circuit and the first sequence detector receive the inverted input signal and the first output of the latch as inputs, wherein both the second keeper sub-circuit and the second sequence detector receive the input signal and the second output of the latch as inputs.

In some implementations, each flip-flop of the plurality of flip-flops includes a plurality of electrical relationship wherein a first electrical relationship of the plurality of electrical relationships is when the first differential sub-circuit is activated, the second differential sub-circuit is deactivated, the first keeper sub-circuit is deactivated, and the second keeper sub-circuit is deactivated, wherein a second electrical relationship of the plurality of electrical relationships is when the second differential sub-circuit is activated, the first differential sub-circuit is deactivated, the first keeper sub-circuit is deactivated, and the second keeper sub-circuit is deactivated, wherein a third electrical relationship of the plurality of electrical relationships is when the first keeper sub-circuit is activated, the second keeper sub-circuit is deactivated, the first differential sub-circuit is deactivated, the second differential sub-circuit is deactivated, and a first pull-down transistor of the first buffer is deactivated, wherein a fourth electrical relationship of the plurality of electrical relationships is when the second keeper sub-circuit is activated, the first keeper sub-circuit is deactivated, the first differential sub-circuit is deactivated, and the second differential sub-circuit is deactivated, and a second pull-down transistor of the second buffer is deactivated, wherein a fifth electrical relationship of the plurality of electrical relationships is when the first differential sub-circuit of the latch is activated when the main clock signal is at the first level, and when the second differential sub-circuit of the latch is activated when the main clock signal is at the first level, wherein a sixth electrical relationship of the plurality of electrical relationships is when the first keeper sub-circuit is activated when the main clock signal is at the second level, and when the second keeper sub-circuit is activated only when the main clock signal is at the second level, and wherein a seventh electrical relationship of the plurality of electrical relationships is when the second output of the latch is the inverted polarity of the first output of the latch.

In some implementations, the first differential sub-circuit of the latch includes a first reduction transistor configured to reduce a first charge sharing between the first output of the latch and the third shared clock node, and wherein the second differential sub-circuit of the latch includes a second reduction transistor configured to reduce a second charge sharing between the second output of the latch and the third shared clock node, and wherein each flip-flop of the plurality of flip-flops further includes a first delay electrical element positioned between the first output of the latch and the first sequence detector, and a second delay electrical element positioned between the second output of the latch and the second sequence detector.

In some implementations, the latch further includes a third keeper sub-circuit electrically coupled to the first sequence detector and the second sequence detector, wherein the third keeper sub-circuit is activated when the input signal is different than the first output of the latch and deactivated when the input signal is at same level as the first output of the latch, wherein the third keeper sub-circuit is electrically coupled to the second shared clock node, and wherein the third keeper sub-circuit is further electrically coupled to the first keeper sub-circuit and the second keeper sub-circuit.

In some implementations, the plurality of flip-flops are electrically coupled to at most three clock-activated transistors, and wherein each source terminal of the first clock-activated transistor, the second clock-activated transistor, and the third clock-activated transistor is electrically coupled to at least one of a high-power supply or a low-power supply.

In some implementations, each flip-flop of the plurality of flip-flops further includes a first buffer electrically coupled to the first shared clock node, a first sequence detector including the first buffer and electrically couples to the first output of the latch, the second output of the latch, an input signal, and an inverted input signal, wherein the first sequence detector configured to activate a first transistor and a second transistor in response to (1) the input signal is the opposite logic polarity compared to the first output of the latch when a main clock signal is at a first level, (2) the first transistor and the second transistor are deactivated when the main clock signal is at a second level, and wherein activating the first transistor and the second transistor when the main clock signal is at the first level activates the latch to capture a data bit from the input signal and to generate an output signal based on a level of the captured data bit when the main clock signal transitions from the first level to the second level.

In some implementations, the first keeper sub-circuit is activated in response to a change in the input signal that is the opposite logic polarity compared to the first output of the latch when a main clock signal is at a second level, and wherein when the first keeper sub-circuit is activated, a pull-down transistor of the first buffer is deactivated, the first transistor is deactivated and the second transistor is deactivated.

In some implementations, the first keeper sub-circuit is configured to receive, as inputs, the first output of the latch, the second output of the latch, the input signal, and the inverted input signal, and wherein the latch further includes at least a first intermediate node and a second intermediate node, and at least the first transistor and the second transistor configured to be activated simultaneously by the output of the first buffer, and wherein the first transistor and the second transistor are electrically coupled to the third shared clock node.

In some implementations, the first keeper sub-circuit includes an inverter feedback loop at a bottom-most position of a pull-down network, wherein the pull-down network includes a third transistor, a fourth transistor, a fifth transistor, a sixth transistor and the inverter feedback loop, and wherein inverter feedback loop includes an inverter and a seventh transistor, and wherein the seventh transistor of the inverter feedback loop is electrically coupled to the third shared clocked node.

In some implementations, the latch further includes a second keeper sub-circuit electrically coupled to an input signal and an inverted input signal, wherein the second keeper sub-circuit is activated in response to a change in the input signal when a main clock signal being at a first level, and wherein the second keeper sub-circuit is electrically coupled to the second shared clock node, and wherein the second keeper sub-circuit is electrically cross-coupled to a first intermediate node of the latch and a second intermediate node of the latch.

Some implementations relate a compound sequential circuit including a first clock-activated transistor electrically coupled to a first shared clock node, a second clock-activated transistor coupled to a second shared clock node, a third clock-activated transistor coupled to a third shared clock node, a plurality of flip-flops, wherein each flip-flop of the plurality of flip-flops include a latch electrically coupled to the second shared clock node and the third shared clock node, a first buffer electrically coupled to the first shared clock node, a second buffer electrically coupled to the first shared clock node, a first keeper sub-circuit electrically coupled to the third shared clock node and at least one of a first output or a second output of the latch, a second keeper sub-circuit electrically coupled to the third shared clock node and the second output of the latch, wherein first keeper sub-circuit is electrically coupled to the first output of the latch, a first sequence detector including the first buffer and electrically couples to the first output of the latch and to an inverted input signal, a second sequence detector including the second buffer and electrically couples to the second output of the latch and to an input signal, and wherein the first keeper sub-circuit is gated by the first output of the latch and the inverted input signal, and wherein the second keeper sub-circuit is gated by the second output of the latch and the input signal.

In some implementations, the first sequence detector configured to activate a first differential sub-circuit of the latch in response to (1) the first output of the latch being at a second level, (2) the input signal being at a first level, and (3) a main clock signal being at the first level, wherein the first differential sub-circuit of the latch is deactivated when the main clock signal is at the second level, wherein the second sequence detector configured to activate a second differential sub-circuit of the latch in response to (1) the first output of the latch being at a first level, (2) the input signal being at a second level, and (3) a main clock signal being at the first level, wherein the second differential sub-circuit of the latch is deactivated when the main clock signal is at the second level, wherein the first differential sub-circuit of the latch and second differential sub-circuit of the latch are electrically coupled to the third shared clock node, and wherein the inputs of the first keeper sub-circuit have the same logic polarities compared to the inputs of the first sequence detector, and wherein the inputs of the second keeper sub-circuit have the same logic polarities compared to the inputs of the second sequence detector.

In some implementations, the first keeper sub-circuit is activated in response to (1) the first output of the latch being at the second level, (2) the input signal being at the first level, and (3) a main clock signal being at the second level, wherein the second keeper sub-circuit is activated in response to (1) the first output of the latch being at the first level, (2) the input signal being at the second level, and (3) a main clock signal being at the second level, and wherein both the first keeper sub-circuit and the first sequence detector receive the inverted input signal and the first output of the latch as inputs, wherein both the second keeper sub-circuit and the second sequence detector receive the input signal and the second output of the latch as inputs.

In some implementations, the first differential sub-circuit of the latch includes a first reduction transistor configured to reduce a first charge sharing between the first output of the latch and the third shared clock node, and wherein the second differential sub-circuit of the latch includes a second reduction transistor configured to reduce a second charge sharing between the second output of the latch and the third shared clock node, and wherein each flip-flop of the plurality of flip-flops further includes a first delay electrical element positioned between the first output of the latch and the first sequence detector, a second delay electrical element positioned between the second output of the latch and the second sequence detector, and wherein the latch further includes a third keeper sub-circuit electrically coupled to the first sequence detector and the second sequence detector, wherein the third keeper sub-circuit is activated when the input signal is different than the first output of the latch and deactivated when the input signal is at same level as the first output of the latch, wherein the third keeper sub-circuit is electrically coupled to the second shared clock node, and wherein the third keeper sub-circuit is further electrically coupled to the first keeper sub-circuit and the second keeper sub-circuit.

In some implementations, the plurality of flip-flops are electrically coupled to at most three clock-activated transistors, and wherein each source terminal of the first clock-activated transistor, the second clock-activated transistor, and the third clock-activated transistor is electrically coupled to at least one of a high-power supply or a low-power supply.

Some implementations relate to a method for generating data outputs for a plurality of flip-flops based on sampled data inputs. The method includes when a clock signal is at a first level and in response to a first change in an input signal that is an opposite logic polarity compared to an output of a latch, activating a sequence detector, wherein the sequence detector activates a differential sub-circuit of a latch, and activating a keeper sub-circuit of the latch. The method further includes when the clock signal is at a second level activating, for a duration, the latch, and deactivate the latch when the output of latch becomes a same level as the input signal, wherein the duration starts when the clock signal goes to the second level and the duration ends when the output of latch becomes the same level as the input signal, and in response to a second change in the input signal that is the opposite logic polarity compared to the output of the latch, activating a keeper sub-circuit.

In some implementations, the plurality of flip-flops are electrically coupled to at most three clock-activated transistors, and wherein each source terminal of a first clock-activated transistor, a second clock-activated transistor, and a third clock-activated transistor is electrically coupled to at least one of a high-power supply or a low-power supply.

Figure 1:
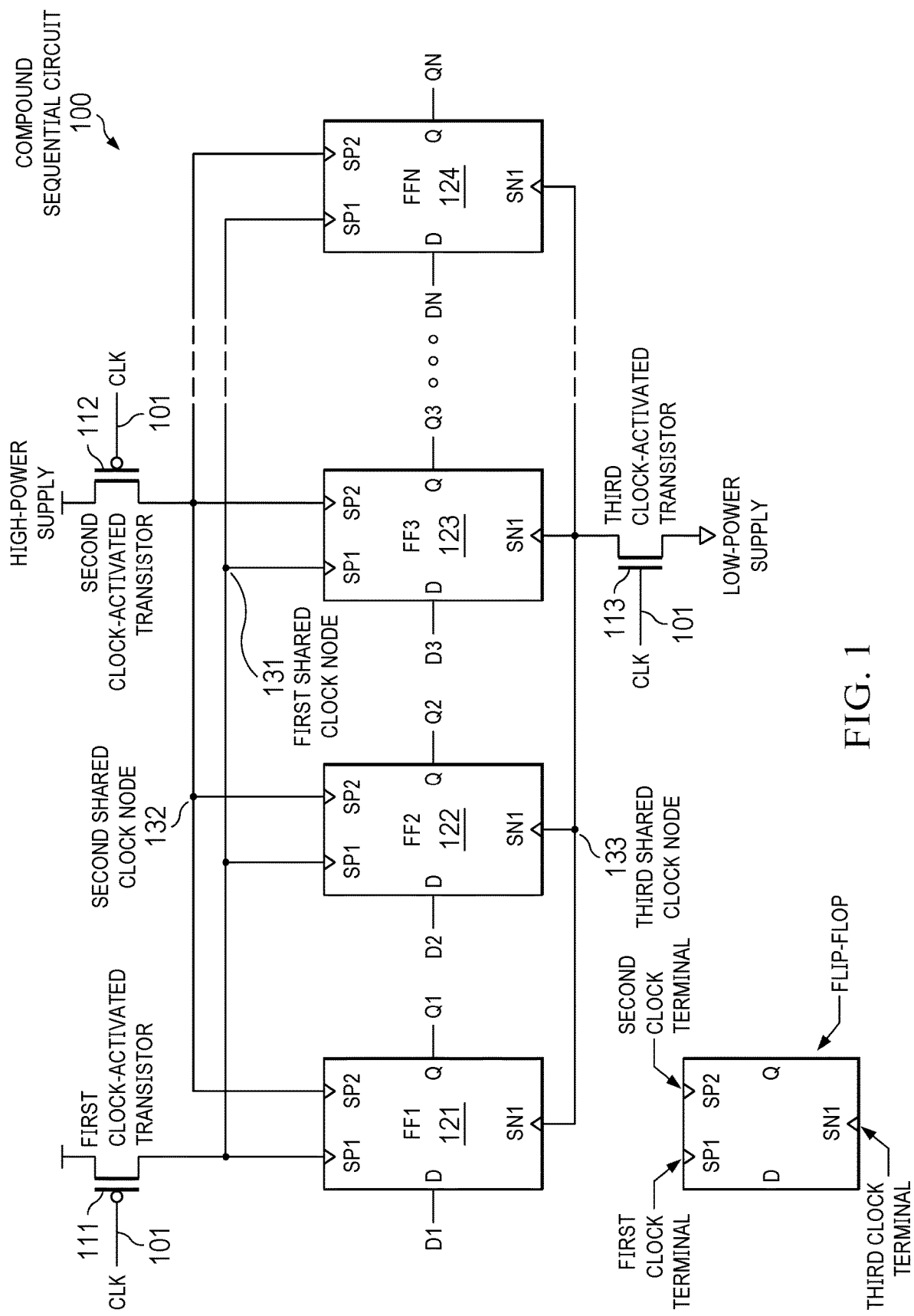
FIG. 1 is a block diagram illustrating a compound sequential circuit architecture, according to an illustrative implementation.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

Referring generally to the figures, the systems and methods relate to circuits and techniques for generating data outputs utilizing shared clock-activated transistors, particularly in very large large-scale integration (VLSI) systems such as central processing units (CPUs), graphics processing units (GPUs), system-on-a-chip (SOC), and internet of things (IoT) devices.

In many highly pipelined microprocessor systems, flip-flops are used in each pipeline stage to divide the processing logic for higher performance gains. Low power has become a dominant design priority with rise of mobile and battery operated ecosystem. Chief contributor to the power consumption of a digital system is the clock network, namely the large number of transistors that can be coupled to the clock network and are driven by the clock signal. That is, the large number of clock-coupled transistors inside a flip-flop burdens the clock signal. For example, a conventional flip-flop can have up to 12 transistors coupled to the clock signal (referred to herein as "clock-activated transistors" or "clock-coupled transistors"). Accordingly, many digital systems like CPUs or SOCs can have upwards of one hundred thousand to over millions of flip-flops, and the clock network in the digital systems can account for up to forty percent (40%) of the total power consumption. Additionally, with hundreds of thousands to millions of flip-flops used within a digital system, the large number of clock-activated transistors can force the clock network to use larger clock buffers to adequately drive the conventional flip-flops and thereby, increases the size of the clock trees. Thus, reducing the number of clock-activated transistors per flip-flop or per-compound circuit reduces the burden on the clock network and thus, reduces the total power consumption of the digital system. Furthermore, reducing total power consumption of clock networks by incorporating shared clock-activated transistors improves flip-flop circuit architectures while (1) avoiding (or reducing) contentions within the digital system, (2) reducing voltage drops across nodes of the digital system, and (3) restricting toggling of internal nodes when the main input signal is constant.

Accordingly, the circuits and methods described herein disclose a compound sequential circuit architecture for sharing clock-activated transistors (sometimes referred to as "clock-coupled transistor") across N number of flip-flops. That is, instead of each flip-flop within the N-bit array including clock-coupled transistors, each flip-flop includes clock terminals to electrically couple to other flip-flops. In this manner, multiple flip-flops can be chained together within an N-bit array controlled by a few clock-activated transistors. For comparison purposes, an array of 8 conventional flip-flops can have 96 clock-activated transistors, whereas an 8-bit array of the present circuits and methods has three clock-activated transistors. In this particular example and described herein, the operation of the 8-bit flip-flop array is (1) fully-static, (2) contention-free while utilizing single phase clocking without using local clock buffers, and (3) all internal nodes of the 8-bit flip-flop do not toggle when all the inputs are constant.

In general, a Metal-Oxide Semiconductor Field-Effect Transistor (planar MOSFET) describes a type of transconductance (or transconductive) device that may be used in modern VLSI systems. Planar MOSFETs (referred to hereafter as "MOSFETs") are designed as one of two basic types, n-channel and p-channel. N-channel MOSFETs open a conductive path between the source and drain when a positive voltage greater than the device's threshold voltage (VT) is applied from the gate to the source. P-channel MOSFETs open a conductive path when a voltage greater than the device's threshold voltage is applied from the source to the gate. Complimentary MOSFET (CMOS) describe a circuit designed with a mix of n-channel and p-channel MOSFETs. In CMOS designs, n-channel and p-channel may be arranged such that a second level on the gate of a MOSFET turns an n-channel device on (e.g., opens a conductive path), and turns a p-channel MOSFET off (e.g., closes conductive path). Conversely, a first level on the gate of a MOSFET turns a p-channel on and an n-channel off. It should be understood that while CMOS logic is used in the examples, any suitable digital logic process may be used for the circuits and methods described herein. Furthermore, all drawings depict n-channel and p-channel MOSFETs as three terminal devices including a drain, gate, and source unless stated otherwise. Moreover, the fourth terminal being the body substrate is assumed to be coupled to low-power supply for n-channel and high-power supply for p-channel unless stated otherwise. Notwithstanding planar MOSFET technology, the following FIGS. can be applied to FinFET transistor technologies or any suitable 3D vertical transistors such as FinFET, GAAFET (Gate All Around), and Fe FET (ferroelectric).

Additionally, aspects of the present disclosure address problems in existing flip-flop circuit architectures by providing an improved power consumption technique utilizing shared clock-activated transistors that may reduce the transistor load on the clock network by up to eighty percent (80%). Furthermore, aspects of the present disclosure incorporate techniques that enable flip-flop circuits to remain fully-static and operate contention free. In addition to reducing the loading on the clock network, aspects of the present disclosure also avoid dependency on sizing relationship of transistor thereby allowing the various circuits described herein to be insensitive to process variation (e.g., attributes of transistors such as length, widths, oxide thickness).

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation. Other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Referring to FIG. 1, a block diagram illustrating a compound sequential circuit architecture 100 (hereafter referred to herein as "circuit architecture 100"), according to an illustrative implementation. In some implementations, the circuit architecture 100 includes an N-bit array of flip-flops electrically coupled to each other via three shared clock nodes. Each flip-flop (FF1 121, FF2 122, FF3 123 . . . FFN 124) can include three clock terminals (SP1, SP2, SN1), an input signal (D1, D2, D3 . . . DN), and an output signal (Q1, Q2, Q3 . . . QN). It should be understood that N is the number of flip-flops in the array, and is an integer number greater than one. In some implementations, the first clock terminal SP1 is electrically coupled to the first shared clock node 131, the second clock terminal SP2 is electrically coupled to the second shared clock node 132, and the third clock terminal SN1 is electrically coupled to the third shared clock node 133. In some implementations, each of the shared clock nodes can be electrically coupled to a clock-activated transistor. For example, the first shared clock node 131 is electrically coupled to a first clock-activated transistor 111, the second shared clock node 132 is electrically coupled to a second clock-activated transistor 112, and the third shared clock node 133 is electrically coupled to a third clock-activated transistor 113. As shown, the first clock-activated transistor 111 and second clock-activated transistor 112 can be electrically coupled to high-power supply, while the third clock-activated transistor 113 can be electrically coupled to low-power supply. Each of the clock-activated transistors can be driven by a main clock signal 101. In some implementations, the N-bit array of flip-flops has at most three clock-activated transistors electrically coupled to the main clock signal 101. In particular, as shown with reference to FIGS. 3-6 and 8-15, none of the flip-flops include a clock-activated transistors (e.g., FF1 121-FFN 124).

Figure 2:
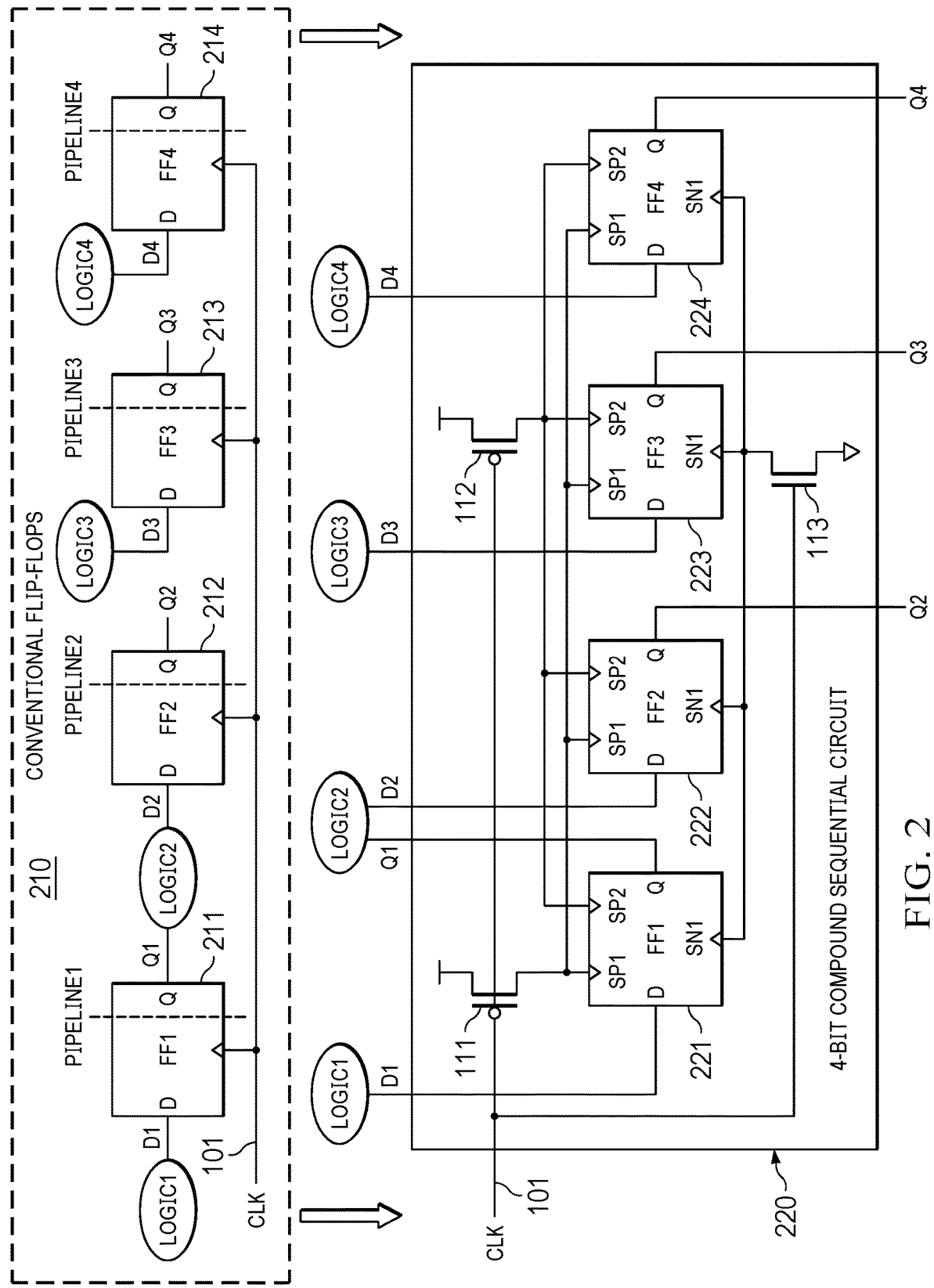
FIG. 2 is a block diagram illustrating the compound sequential circuit architecture of FIG. 1 used in a pipeline system, according to an illustrative implementation.

Referring to FIG. 2, a block diagram illustrating the compound sequential circuit architecture 100 of FIG. 1 used in a pipeline system, according to an illustrative implementation. In general, FIG. 2 depicts how the compound sequential circuit architecture 100 can be applied to a digital system, such as a microprocessor. For example, a microprocessor includes pipeline stages each separated by flip-flops to hold the intermediate results. In this example, there are four flip-flops (N=4) in the N-bit array. Flip-flops FF1 211-FF4 214 can be conventional flip-flops each having ten clock-activated transistors as depicted by conventional flip-flops 210. In particular, flip-flop FF1 211 samples a data bit at input signal D1 originating from logic unit 1 (LOGIC1) and generates an output signal Q1 that is an input to logic unit 2 (LOGIC2). The output of logic unit 2 is the input signal D2 of flip-flop FF2 212 which generates an output signal Q2 used elsewhere in the digital system. A logic unit 3 (LOGIC3) provides the input signal D3 to flip-flop FF3 213 which generates an output signal Q3 used elsewhere in the digital system. Finally, a logic unit 4 (LOGIC4) provides the input signal D4 to flip-flop FF4 214 which generates an output signal Q4 used elsewhere in the digital system. All the flip-flops (211-214) can be controlled by a main clock signal 101 (CLK). Since each conventional flip-flop (e.g., FF1 211-FF4 214) may have ten clock-activated transistors, the total transistor load on the main clock signal 101 can be 40 transistors. Furthermore, FIG. 2 shows how conventional flip-flops 210 can be replaced by the 4-bit compound sequential circuit 220 using the compound sequential circuit architecture 100 of FIG. 1, which contains the same four input signals (D1-D4) and same four output signals (Q1-Q4). Input signals D1-D4 come from the same sources and output signals Q1-Q4 have the same destinations as conventional flip-flops 210 and can be re-mapped onto the 4-bit compound sequential circuit 220, which also is controlled by main clock signal 101. However, instead of 40 transistors burdening the main clock signal 101, only three transistor loads are presented to main clock signal 101 in the case of 4-bit compound sequential circuit 220.

Figure 3:
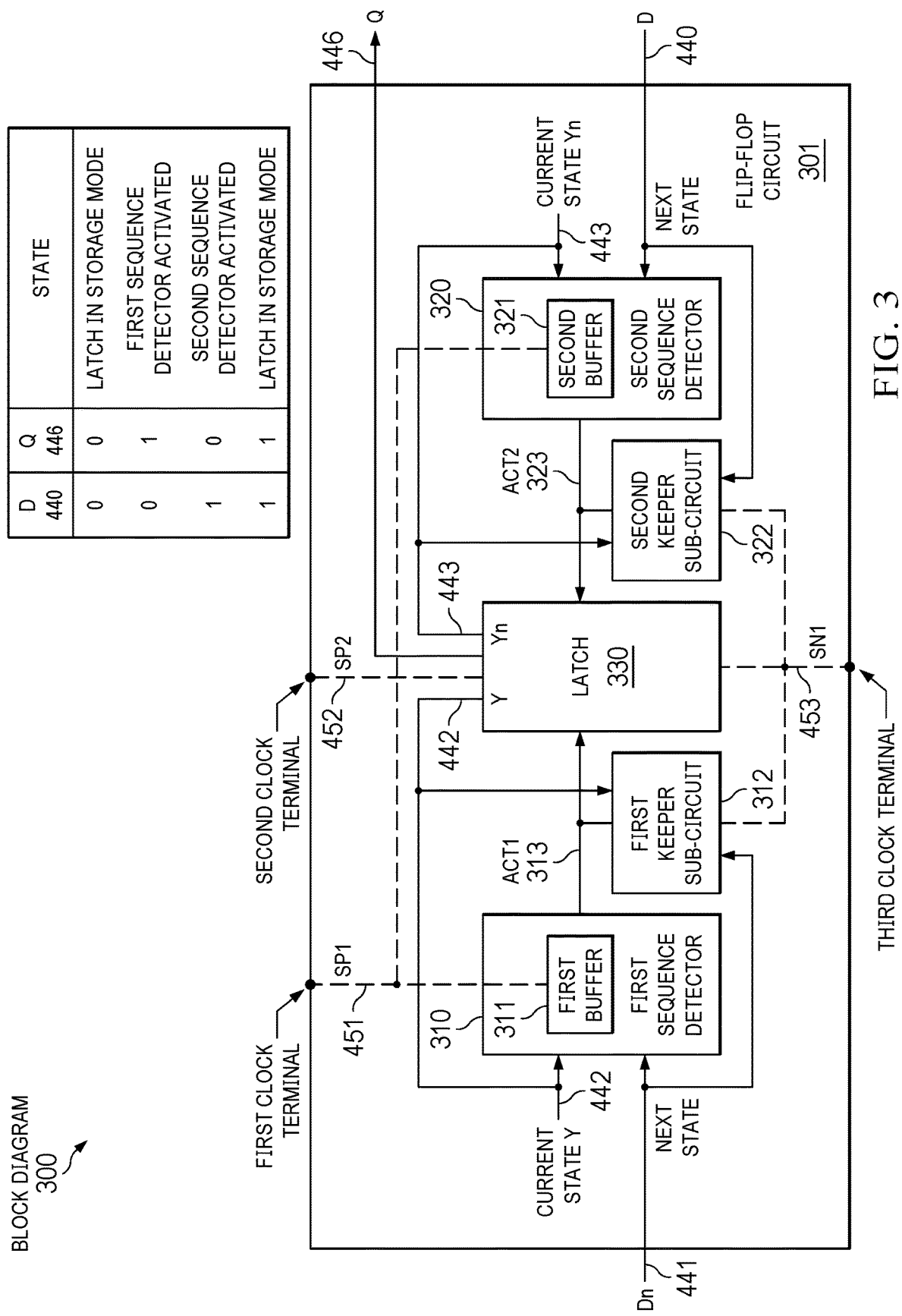
FIG. 3 is a block diagram illustrating a flip-flop circuit of the compound sequential circuit architecture of FIG. 1, according to an illustrative implementation.

Referring now to FIG. 3, a block diagram illustrating a flip-flop circuit 301 of the compound sequential circuit architecture 100 of FIG. 1, according to an illustrative implementation. In general, FIG. 3 discloses the composition of a flip-flop that can be found in compound sequential circuit architecture 100. Flip-flop circuit 301 includes a first sequence detector 310, a second sequence detector 320, a first buffer 311, a second buffer 321, a first keeper sub-circuit 312, and a second keeper sub-circuit 322, and a latch 330. In some implementations, the first buffer 311 is within the first sequence detector 310, and the second buffer 321 is within the second sequence detector 320. In some implementations, the buffers within the sequence detectors described herein could be a separate circuit and/or system external from the sequence detector.

In some implementations, latch 330 can be differential latch including an input sub-circuit or side, connected to signals ACT1 313, called the first differential sub-circuit (sometimes referred to as a "side") and an inverted input sub-circuit or side, connected to signals ACT2 323, called the second differential sub-circuit. Latch 330 also can include differential outputs including a first output Y 442 and a second output Yn 443 (sometimes referred to as an "inverted second output Yn 443"). First output Y 442 and second output Yn 443 have opposite polarities.

In some implementations, the first sequence detector 310 is electrically coupled (e.g., via to the first differential sub-circuit of latch 330, and the second sequence detector 320 is electrically coupled to the second differential sub-circuit of latch 330. Furthermore, the first sequence detector 310 is electrically coupled to the first keeper sub-circuit 312, and the second sequence detector 320 is electrically coupled to the second keeper sub-circuit 322. In some implementations, the input signal D 440 can be electrically coupled to the second sequence detector 320 and to the second keeper sub-circuit 322, whereas the inverted input signal Dn 441 can be electrically coupled to the first sequence detector 310 and to the first keeper sub-circuit 312. As shown, the first output Y 442 of latch 330 is electrically coupled to the first sequence detector 310 and to the first keeper sub-circuit 312. Additionally, as shown, the second output Yn 443 of latch 330 is electrically coupled to the second sequence detector 320 and to the second keeper sub-circuit 322. It should be understood that the inputs of the first keeper sub-circuit 312 have the same logic polarity as the inputs of the first sequence detector 310, and furthermore, the inputs of the second keeper sub-circuit 322 have the same logic polarity as the inputs of the second sequence detector 320. Output signal Q 446 is the output of the exemplary flip-flop and is electrically coupled to latch 330.

As described herein, no clock-activated transistors are shown within flip-flop circuit 301. Instead, the flip-flop circuit 301 is electrically coupled to first clock terminal SP1 451, a second clock terminal SP2 452, and a third clock terminal SN1 453, each of which are shared across flip-flip circuits. In some implementations, the first buffer 311 is electrically coupled to the second buffer 321 via first clock terminal SP1 451, and latch 330 is electrically coupled to the second clock terminal SP2 452 and to the third clock terminal SN1 453. In some implementations, the third keeper sub-circuit within latch 330 (shown in FIG. 4) is electrically coupled to the second clock terminal SP2 452. In some implementations, the first keeper sub-circuit 312 is electrically coupled to the second keeper sub-circuit 322 via third clock terminal SN1 453, and the first differential sub-circuit of latch 330 is electrically coupled to the second differential sub-circuit of latch 330 also via the third clock terminal SN1 453. Consequently, the first and second differential sub-circuits of latch 330 are electrically coupled to the first keeper sub-circuit 312 and the second keeper sub-circuit 322.

In some implementations, the first output Y 442 and inverted input signal Dn 441 are electrically coupled to the first sequence detector 310, and the second output Yn 443 and input signal D 440 are electrically coupled to the second sequence detector 320. As a result, both sequence detectors (310 and 320) can monitor the current state (Y and Yn) from latch 330 and the next state (D and Dn) from input signal D 440 every clock cycle. If the next state and the current state are at the same level, latch 330 is in storage mode and maintains the output signal Q 446 at a current level. In some implementations, monitoring can include passively comparing the input D against the output Y for changes, and when the input changes and becomes an opposite polarity versus output Y, the sequence detectors activates ACT1 or ACT2 signals (e.g., the sequence detector monitors the input signal for changes). Thus, sequences (1) D=1, Q=1 and (2) D=0, Q=0 instruct both sequence detectors 310 and 320 to (1) de-assert signal ACT1 313, (2) de-assert signal ACT2 323 (de-assert refers to deactivating, e.g., logic 0=0V=first level), and while (3) latch 330 remains in storage mode retaining the level of output signal 446 (Q). When the first output Y 442 is at a second level (e.g., high) and input signal 440 transitions to a first level (e.g., low), the first sequence detector 310 is enabled and asserts signal ACT1 313 (e.g., second level) when the main clock signal 101 is at a first level. Signal ACT1 313 also enables the first differential sub-circuit of latch 330. Thus, detection of sequence D=0 and Q=1 causes the first sequence detector 310 to be enabled and in turn enables latch 330.

When the first sequence detector 310 is enabled, signal ACT2 323 remains de-asserted (e.g., first level), and the second sequence detector 320 remains disabled. When the second output Yn 443 is at a second level and input signal 440 transitions to a second level, the second sequence detector 320 is enabled to assert signal ACT2 323 when the main clock signal 101 is at a first level. Signal ACT2 323 also enables the second differential sub-circuit of latch 330. Thus, detection of sequence D=1 and Q=0 causes the second sequence detector 320 to be enabled and in turn enables latch 330.

When the second sequence detector 320 is enabled, signal ACT1 313 remains de-asserted and the first sequence detector remains disabled. It should be understood that both sequence detectors cannot be enabled simultaneously and furthermore, either first or second sequence detector can assert signal ACT1 313 or ACT2 323, respectively, when the main clock signal 101 is at a first level. The truth table shown in FIG. 3 summarizes the sequences to enable each sequence detector and when latch 330 remains in storage mode.

Figure 4:
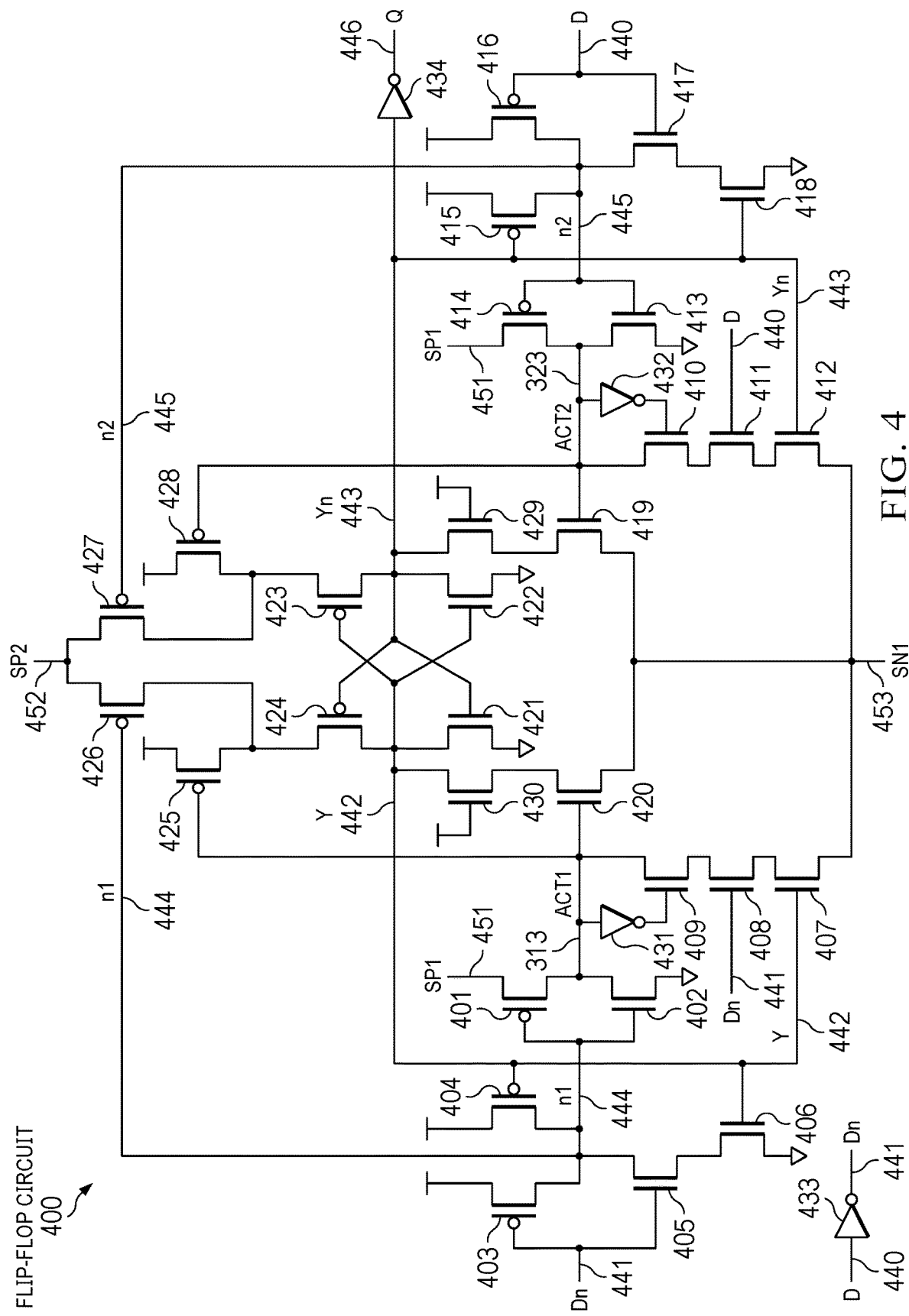
FIG. 4 is a circuit diagram illustrating a flip-flop circuit of FIG. 3 of the compound sequential circuit architecture of FIG. 1, according to an illustrative implementation.

Referring to FIG. 4, a circuit diagram illustrating a flip-flop circuit 400 of FIG. 3 of the compound sequential circuit architecture 100 of FIG. 1, according to an illustrative implementation. In some implementations, the first sequence detector 310 (with reference to FIG. 3) includes transistors 403, 404, 405, 406 and the first buffer 311 which includes transistors 401 and 402, where transistor 402 is a first pull-down transistor of the first buffer 311. In some implementations, the second sequence detector 320 includes transistors 415, 416, 417, 418 and the second buffer 321 which includes transistors 414 and 413, where transistor 413 is the second pull-down transistor of the second buffer 321. In some implementations, the first keeper sub-circuit 312 includes transistors 407 408, 409, and inverter 431 and the second keeper sub-circuit 322 includes transistors 410, 411, 412, and inverter 432. In some implementations, latch 330 includes transistors 430, 420, 425, 424, 421, 429, 419, 428, 423, 422, 426, and 427. The first differential sub-circuit of latch 330 includes transistors 430 and 420 while the second differential sub-circuit of latch 330 includes transistors 429 and 419. Transistor 430 is the first reduction transistor, and transistor 429 is the second reduction transistor. Transistors 426 and 427 represent components of the third keeper sub-circuit within latch 330. Input signal D 440 is electrically coupled to the input of inverter 433 to generate the inverted input signal Dn 441. The second output Yn 443 of latch 330 is electrically coupled to the input of inverter 434 to generate the output signal Q 446. Inverter 434 is an isolation buffer to isolate the output signal 446 from the internal nodes of flip-flop circuit 400.

Generally referring to the connectivity of flip-flop circuit 400. In some implementations, the first sequence detector 310, the drain terminals of transistors 403, 404, and 405 are electrically coupled to node n1 444. The source terminals of transistors 403 and 404 are electrically coupled to high-power supply. The source terminal of transistor 405 is electrically coupled to the drain terminal of transistor 406. The source terminal of transistor 406 is electrically coupled to low-power supply. The gate terminals of transistors 403 and 405 are electrically coupled to the inverted input signal Dn 441 while the gate terminals of transistors 404 and 406 are electrically coupled to the first output Y 442 of latch 330. Node n1 444 is electrically coupled to the gate terminals of transistors 401 and 402, and node n1 444 is also the input to the first buffer 311. The source terminal of transistor 401 is electrically coupled to the first clock terminal SP1 451. The drain terminals of transistors 401 and 402 are electrically coupled to signal ACT1 313 which is also the output of the first buffer 311. The source terminal of transistor 402 is electrically coupled to low-power supply.

With reference to the second sequence detector 320, the drain terminals of transistors 415, 416, and 417 are electrically coupled to node n2 445. The source terminals of transistors 415 and 416 are electrically coupled to high-power supply. The source terminal of transistor 417 is electrically coupled to the drain terminal of transistor 418. The source terminal of transistor 418 is electrically coupled to low-power supply. The gate terminals of transistors 416 and 417 are electrically coupled to the input signal D 440, while the gate terminals of transistors 415 and 418 are electrically coupled to the second output Yn 443 of latch 330. Node n2 445 is electrically coupled to the gate terminals of transistors 414 and 413, and node n2 445 is also the input to the second buffer 321. The source terminal of transistor 414 is electrically coupled to the first clock terminal SP1 451. The drain terminals of transistors 414 and 413 are electrically coupled to signal ACT2 323 which is also the output of the second buffer 321. The source terminal of transistor 413 is electrically coupled to low-power supply.

With reference to the first keeper sub-circuit 312, signal ACT1 313 is electrically coupled to both the input of inverter 431 and the drain terminal of transistor 409. The gate terminal of transistor 409 is electrically coupled to the output of inverter 431, and the source terminal of transistor 409 is electrically coupled to the drain terminal of transistor 408. The gate terminal of transistor 408 is electrically coupled to the inverted input signal Dn 441, and the source terminal of transistor 408 is electrically coupled to the drain terminal of transistor 407. The gate terminal of transistor 407 is electrically coupled to the first output Y 442, and the source terminal of transistor 407 is electrically coupled to the third clock terminal SN1 453. Transistors 409, 408, and 407 form a three stack series-coupled pull-down network. It should be understood that the transistor ordering within the stack can be interchanged without impacting functionality or performance.

With reference to the second keeper sub-circuit 322, signal ACT2 323 is electrically coupled to both the input of inverter 432 and the drain terminal of transistor 410. The gate terminal of transistor 410 is electrically coupled to the output of inverter 432, and the source terminal of transistor 410 is electrically coupled to the drain terminal of transistor 411. The gate terminal of transistor 411 is electrically coupled to the input signal D 440, and the source terminal of transistor 411 is electrically coupled to the drain terminal of transistor 412. The gate terminal of transistor 412 is electrically coupled to the second output Yn 443, and the source terminal of transistor 412 is electrically coupled to the third clock terminal SN1 453. In this manner, the first and second keeper sub-circuits are electrically coupled to each other via the third clock terminal SN1 453. Transistors 410, 411, and 412 also form a three stack series-coupled pull-down network. It should be understood that the transistor ordering within this stack also can be interchanged without impacting functionality or performance.

With reference to latch 330, transistors 430 and 420 of the first differential sub-circuit are electrically coupled in-series. The drain terminal of transistor 430 is electrically coupled to the first output Y 442, and the gate terminal of transistor 430 is electrically coupled to high-power supply. The gate terminal of transistor 420 is electrically coupled to signal ACT1 313, and the source terminal of transistor 420 is electrically coupled to the third clock terminal SN1 453. Transistors 429 and 419 of the second differential sub-circuit are electrically coupled in-series. The drain terminal of transistor 429 is electrically coupled to the second output Yn 443, and the gate terminal of transistor 429 is electrically coupled to high-power supply. The gate terminal of transistor 419 is electrically coupled to signal ACT2 323, and the source terminal of transistor 419 is electrically coupled to the third clock terminal SN1 453. In this manner, the first and second differential sub-circuits of latch 330 also are electrically coupled to the first and second keeper sub-circuits via the third clock terminal SN1 453. Transistors 424 and 421 form a cross-coupled pair with transistors 423 and 422. The gate terminals of transistors 424 and 421 are electrically coupled to the drain terminals (also known as second output Yn 443) of transistors 423 and 422. Likewise, the gate terminals of transistors 423 and 422 are electrically coupled to the drain terminals (also known as first output Y 442) of transistors 424 and 421. The source terminals of transistors 421 and 422 are electrically coupled to low-power supply. The source terminal of transistor 424 is electrically coupled to the drain terminals of transistors 425 and 426. The gate terminal of transistor 425 is electrically coupled to signal ACT1 313, and the gate terminal of transistor 426 is electrically coupled to node n1 444. The source terminal of transistor 423 is electrically coupled to the drain terminals of transistors 428 and 427. The gate terminal of transistor 428 is electrically coupled to signal ACT2 323, and the gate terminal of transistor 427 is electrically coupled to node n2 445. The source terminals of transistors 425 and 428 are electrically coupled to high-power supply while the source terminals of transistors 426 and 427 are electrically coupled to the second clock terminal SP2 452.

Now referring to the operation of flip-flop circuit 400. As shown in the truth table of FIG. 3 when both input signal D 440 and output signal Q 446 are at the same level, latch 330 is in a storage mode state. In some implementations, transistors 425, 424, and 421 form an inverter-like cross-coupled pair with transistors 428, 423, and 422 to retain the current levels of first output Y 442 and second output Yn 443. For example, when input signal D 440 is constant, both the first and second sequence detectors are disabled and transistors 402 and 413 remain activated. Transistors 425 and 428 are activated in response to de-asserting both signals ACT1 313 and ACT2 323. If first output Y 442 is at a first level and second output Yn 443 is at a second level, transistors 423 and 421 are activated. Transistor 421 maintains the first output Y 442 at a first level every clock cycle, and transistors 423 and 428 maintain the second output Yn 443 at a second level every clock cycle. It should be understood that as signal ACT1 313 is held at a first level by transistor 402, transistor 409 is activated; however, a deactivated transistor 407 prevents the first keeper sub-circuit 312 from activating. Likewise, as signal ACT2 323 is held at a first level by transistor 413, transistor 410 is activated; however, a deactivated transistor 411 prevents the second keeper sub-circuit 322 from activating. Conversely if a first output Y 442 is at a second level and a second output Yn 443 is at a first level, transistors 424 and 422 are activated. Transistor 422 maintains a second output Yn 443 at a first level every clock cycle, and transistors 424 and 425 maintain a first output Y 442 at a second level every clock cycle. In this first and second output combination, transistor 408 is responsible for deactivating the first keeper sub-circuit 312 while transistor 412 is responsible for deactivating the second keeper sub-circuit 322.

If the sequence D=0 and Q=1 is detected (e.g., input signal D 440 transitions from a second level to a first level and output signal Q 446 is at a second level) while the main clock signal 101 is at a first level, transistor 405 is activated to discharge node n1 444 to low-power supply. Transistor 401 is activated to provide a conductive path to high-power supply via first clock-activated transistor 111 and signal ACT1 313 is asserted to activate transistor 420 and thereby, enables the first differential sub-circuit of latch 330. Meanwhile, node n2 445 remains at a second level continuing to activate transistor 413 and thereby, de-asserted signal ACT2 323 disables the second differential sub-circuit of latch 330. When main clock signal 101 transitions to a second level, the third clock-activated transistor 113 discharges the third clock terminal SN1 453 to pull-down first output Y 442 to low-power supply. Transistors 423 and 428 are activated to charge second output Yn 443 to a second level. Isolation buffer 434 generates the new output signal Q 446 at a first level. When the first output Y 442 is at a same level as the input signal D 440 (e.g., first level), transistor 404 is activated to charge node n1 444. Transistor 402 is activated to de-assert signal ACT1 313, and transistor 420 is deactivated, disabling the first differential sub-circuit of latch 330 during a main clock signal 101 being at a second level. With both first and second differential sub-circuits disabled, latch 330 enters into the storage mode state (described herein). In some implementations, the detection of sequence D=0 and Q=1 to enable the first sequence detector 310 is accomplished by series-coupled transistors 405 and 406.

If the sequence D=1 and Q=0 is detected (e.g., input signal D 440 transitions from a first level to a second level and output signal Q 446 is at a first level) while main clock signal 101 is at a first level, transistor 417 is activated to discharge node n2 445 to low-power supply. Transistor 414 is activated to provide a conductive path to high-power supply via the first clock-activated transistor 111 and signal ACT2 323 is asserted to activate transistor 419 and thereby, enables the second differential sub-circuit of latch 330. Meanwhile, node n1 444 remains at a second level continuing to activate transistor 402 and thereby, de-asserted signal ACT1 313 disables the first differential sub-circuit of latch 330. When main clock signal 101 transitions to a second level, the third clock-activated transistor 113 discharges the third clock terminal SN1 453 to pull-down second output Yn 443 to low-power supply. Transistors 424 and 425 are activated to charge first output Y 442 to a second level. Isolation buffer 434 generates the new output signal Q 446 at a second level. When the first output Y 442 is at a same level as the input signal D 440 (e.g., second level), transistor 415 is activated to charge node n2 445. Transistor 413 is activated to de-assert signal ACT2 323, and transistor 419 is deactivated, disabling the second differential sub-circuit of latch 330 during main clock signal 101 at a second level. In some implementations, with both the first and second differential sub-circuits disabled, latch 330 enters into the storage mode state as previously described. The detection of sequence D=1 and Q=0 to enable the second sequence detector 320 is accomplished by series-coupled transistors 417 and 418.

When the input signal D 440 is constant across many clock cycles, transistors 402 and 413 are continuously activated to de-assert signals ACT1 313 and ACT2 323, and thereby both sequence detectors remain inactive. When there is no input activity, all the internal nodes of flip-flop circuit 400 do not toggle and therefore the flip-flop circuit 400 does not consume any dynamic power. However, should the input signal D 440 change while main clock signal 101 is at a second level, either the first keeper sub-circuit 312 or the second keeper sub-circuit 322 is activated depending on which sequence is detected. Only either the first or second keeper sub-circuit can be activated while main clock signal 101 is at a second level. Furthermore, if the first keeper sub-circuit 312 is activated, transistor 402 (also known as first pull-down transistor) of the first buffer 311 must be deactivated. Activation of the first keeper sub-circuit 312 automatically deactivates the first pull-down transistor 402 of first buffer 311 because changes to the inverted input signal Dn 441 result in discharging node n1 444 to a first level. Furthermore, if transistor pair 407/408 is activated, transistor 401 of the first buffer 311 is also activated. Conversely, if the second keeper sub-circuit 322 is activated, transistor 413 (also known as second pull-down transistor) of the second buffer 321 must be deactivated. Activation of the second keeper sub-circuit 322 automatically deactivates the second pull-down transistor 413 of second buffer 321 because changes to the input signal D 440 result in discharging node n2 445 to a first level. Furthermore, if transistor pair 411/412 is activated, transistor 414 of the second buffer 321 is also activated. In other words, it is the responsibility of the first or second keeper sub-circuit to maintain signals ACT1 313 or ACT2 323, respectively, at a first level when input signal D 440 changes while main clock signal 101 is at a second level. Thus, this compound sequential circuit architecture 100 does not allow both the first and second keeper sub-circuits to be activated simultaneously and requires the corresponding transistor in the pull-down network of the first or second buffer to be deactivated upon activation of the first or second keeper sub-circuit. These two rules prevent contention at the three clock terminals when multiple flip-flops are electrically coupled together within the N-bit array.

The following example provides further details on the operation of the first keeper sub-circuit 312. If sequence D=0 and Q=1 is detected while main clock signal 101 is at a second level, transistor 402 is deactivated by node n1 444 discharging to low-power supply. Transistor 401 is activated; however, no conductive path to high-power supply exists at signal ACT1 313 while main clock signal 101 is at a second level. Therefore, signal ACT1 313 is maintained at a first level by three series-coupled transistors 409, 408, and 407. Third clock terminal SN1 453 is already discharged to low-power supply by the third clock-activated transistor 113. Transistor 409 is activated by the output of inverter 431 at a second level. Transistor 408 is activated by inverted input signal Dn 441 at a second level. Transistor 407 is activated by the first output Y 442 at a second level. Therefore, all three series-coupled transistors 409, 408, and 407 are activated to maintain a conductive path to low-power supply for signal ACT1 313 while main clock signal 101 is at a second level. Furthermore, transistor 420 remains deactivated such that the first differential sub-circuit of latch 330 also remains disabled. Signal ACT2 323 also remains de-asserted and thus, transistor 419 is deactivated such that the second differential sub-circuit of latch 330 remains disabled. Despite transistor 410 being activated by signal ACT2 323 at a first level, transistors 411 and 412 are deactivated by their corresponding inputs and thus, the second keeper sub-circuit 322 remains deactivated. Accordingly, it is shown that when the first keeper sub-circuit 312 is activated, the first and second differential sub-circuits and second keeper sub-circuit 322 are disabled. This behavior of the first keeper sub-circuit 312 prevents contention at the three clock terminals when multiple flip-flops are electrically coupled together within the N-bit array.

When main clock signal 101 transitions from a second level to a first level, the third clock-activated transistor 113 is deactivated and the conductive path to low-power supply of the first keeper sub-circuit 312 is interrupted. A conductive path to high-power supply is established via transistor 401 and first clock-activated transistor 111 to charge signal ACT1 313 to a second level without contention from the first keeper sub-circuit 312. As the second differential sub-circuit of latch 330 and the second keeper sub-circuit 322 are disabled, the second output Yn 443 and signal ACT2 323 are decoupled from signal ACT1 313 and therefore, they cannot interfere with the transition of signal ACT1 313 to a second level. When signal ACT1 313 is at a second level, transistor 409 is deactivated to complete the deactivation of the first keeper sub-circuit 312.

The following example provides further details on the operation of the second keeper sub-circuit 322. If sequence D=1 and Q=0 is detected while main clock signal 101 is at a second level, transistor 413 is deactivated by node n2 445 discharging to low-power supply. Transistor 414 is activated; however, no conductive path to high-power supply exists at signal ACT2 323 while main clock signal 101 is at a second level. Therefore, signal ACT2 323 is maintained at a first level by three series-coupled transistors 410, 411, and 412. Third clock terminal SN1 453 is already discharged to low-power supply by the third clock-activated transistor 113. Transistor 410 is activated by the output of inverter 432 at a second level. Transistor 411 is activated by input signal D 440 at a second level. Transistor 412 is activated by the second output Yn 443 at a second level. Therefore, all three series-coupled transistors 410, 411, and 412 are activated to maintain a conductive path to low-power supply for signal ACT2 323 while main clock signal 101 is at a second level. Furthermore, transistor 419 remains deactivated such that the second differential sub-circuit of latch 330 also remains disabled. Signal ACT1 313 also remains de-asserted and thus, transistor 420 is deactivated, such that the first differential sub-circuit of latch 330 remains disabled. Despite transistor 409 being activated by signal ACT1 313 at a first level, transistors 408 and 407 are deactivated by their corresponding inputs and thus, the first keeper sub-circuit 312 remains deactivated. Accordingly, it is shown that when the second keeper sub-circuit 322 is activated, the first and second differential sub-circuits and first keeper sub-circuit 312 are disabled. This behavior of the second keeper sub-circuit 322 is fundamental to preventing contention at the three clock terminals when multiple flip-flops are electrically coupled together within the N-bit array.

When main clock signal 101 transitions from a second level to a first level, the third clock-activated transistor 113 is deactivated and the conductive path to low-power supply of the second keeper sub-circuit 322 is interrupted. A conductive path to high-power supply is established via transistor 414 and first clock-activated transistor 111 to charge signal ACT2 323 to a second level without contention from the second keeper sub-circuit 322. As the first differential sub-circuit of latch 330 and the first keeper sub-circuit 312 are disabled, the first output Y 442 and signal ACT1 313 are decoupled from signal ACT2 323 and therefore, they cannot interfere with the transition of signal ACT2 323 to a second level. When signal ACT2 323 is at a second level, transistor 410 is deactivated to complete the deactivation of the second keeper sub-circuit 322.

In some implementations, either the first or second sequence detector can assert signal ACT1 313 or ACT2 323, respectively, during main clock signal 101 at a first level in response to any changes in the input signal D 440 because the pull-up networks of the first and second buffers are clock-gated by the first clock-activated transistor 111. The assertion of ACT1 313 or ACT2 323 deactivates transistor 425 or 428, respectively, and interrupts the conductive path to high-power supply at either first output Y 442 or second output Yn 443. To avoid first output Y 442 or second output Yn 443 from being in a floating state while main clock signal 101 is at a first level, a third keeper sub-circuit including transistors 426 and 427 is implemented within latch 330 to restore a conductive path to high-power supply via the second clock-activated transistor 112. If sequence D=0 and Q=1 is detected by the first sequence detector 310 and signal ACT1 313 is asserted to deactivate transistor 425, node n1 444, after being discharged to low-power supply by transistors 405 and 406, activates transistor 426. As transistor 424 is still activated, transistor 426 and second clock-activated transistor 112 provide an alternative path to high-power supply at first output Y 442. Likewise, if sequence D=1 and Q=0 is detected by the second sequence detector 320 and signal ACT2 323 is asserted to deactivate transistor 428, node n2 445, after being discharged to low-power supply by transistors 417 and 418, activates transistor 427. As transistor 423 is still activated, transistor 427 and second clock-activated transistor 112 provide an alternative path to high-power supply at second output Yn 443. Thus, the third keeper sub-circuit ensures and maintains fully static operation of latch 330.

When the main clock signal 101 transitions to a second level for latch 330 to latch the changed input data bit, either first output Y 442 or second output Yn 443 is discharged to low-power supply based on the detected sequence. As the output signal Q 446 settles to the same level as input signal D 440, either node n1 444 or node n2 445 is charged to a second level, thereby, deactivating the third keeper sub-circuit. This deactivation of the third keeper sub-circuit during main clock signal 101 at a second level avoids contention among flip-flops when multiple flip-flops are electrically coupled within the N-bit array. In some implementations, another method for avoiding contention is not permitting transistors 426 and 427 to be activated simultaneously.

In some implementations, the flip-flop circuit 400 can include a plurality of electrical relationships. For example, a first electrical relationship of the plurality of electrical relationships is when the first differential sub-circuit is activated, the second differential sub-circuit is deactivated, the first keeper sub-circuit is deactivated, and the second keeper sub-circuit is deactivated. In another example, a second electrical relationship of the plurality of electrical relationships is when the second differential sub-circuit is activated, the first differential sub-circuit is deactivated, the first keeper sub-circuit is deactivated, and the second keeper sub-circuit is deactivated. In yet another example, a third electrical relationship of the plurality of electrical relationships is when the first keeper sub-circuit is activated, the second keeper sub-circuit is deactivated, the first differential sub-circuit is deactivated, the second differential sub-circuit is deactivated, and a first pull-down transistor of the first buffer is deactivated. In yet another example, a fourth electrical relationship of the plurality of electrical relationships is when the second keeper sub-circuit is activated, the first keeper sub-circuit is deactivated, the first differential sub-circuit is deactivated, and the second differential sub-circuit is deactivated, and a second pull-down transistor of the second buffer is deactivated. In yet another example, a fifth electrical relationship of the plurality of electrical relationships is when the first differential sub-circuit of the latch is activated when the main clock signal is at the first level, and when the second differential sub-circuit of the latch is activated when the main clock signal is at the first level. In yet another example, a sixth electrical relationship of the plurality of electrical relationships is when the first keeper sub-circuit is activated when the main clock signal is at the second level, and when the second keeper sub-circuit is activated only when the main clock signal is at the second level. In yet another example, a seventh electrical relationship of the plurality of electrical relationships is when the second output of the latch is the inverted polarity of the first output of the latch. In some implementations, the plurality of flip-flops are electrically coupled to at most three clock-activated transistors, where each source terminal of the first clock-activated transistor, the second clock-activated transistor, and the third clock-activated transistor is electrically coupled to at least one of a high-power supply or a low-power supply.

In some implementations, the first differential sub-circuit transistors 420 and 430 of the latch includes a first reduction transistor 430 configured to reduce a first charge sharing between the first output of the latch (Y 442) and the third shared clock node (SN1 453), and wherein the second differential sub-circuit transistors 419 and 429 of the latch includes a second reduction transistor 429 configured to reduce a second charge sharing between the second output of the latch (Yn 443) and the third shared clock node (SN1 453). In some implementations, the flip-flop circuit 400 includes a first delay electrical element 1437 and 1438 (e.g., shown with reference to FIG. 14) positioned between the first output (Y 442) of the latch and the first sequence detector and a second delay electrical element 1435 and 1436 (e.g., shown with reference to FIG. 14) positioned between the second output of the latch (Yn 443) and the second sequence detector.

In some implementations, the third keeper sub-circuit transistors 426 and 427 of the latch electrically couples to the first sequence detector and the second sequence detector. In particular, the third keeper sub-circuit is activated when the input signal (D 440) is different (e.g., of opposite logic polarity) than the first output (Y 442) of the latch and deactivated when the input signal is at same level as the first output of the latch. In some implementations, the third keeper sub-circuit is electrically coupled to the second shared clock node (SP2 452), and the third keeper sub-circuit is further electrically coupled to the first keeper sub-circuit and the second keeper sub-circuit. In some implementations, the first keeper sub-circuit is gated by the first output (Y 442) of the latch and an inverted input signal (Dn 441), and the second keeper sub-circuit is gated by the second output (Yn 443) of the latch and an input signal (D 440).

In some implementations, the first sequence detector is configured to activate a first differential sub-circuit of the latch in response to (1) the first output (Y 442) of the latch being at a second level, (2) the input signal (D 440) being at a first level, and (3) a main clock signal 101 being at the first level. Furthermore, the first differential sub-circuit of the latch is deactivated when the main clock signal 101 is at the second level. In some implementations, the second sequence detector is configured to activate a second differential sub-circuit of the latch in response to (1) the first output (Y 442) of the latch being at a first level, (2) the input signal (D 440) being at a second level, and (3) a main clock signal 101 being at the first level. Furthermore, the second differential sub-circuit of the latch is deactivated when the main clock signal 101 is at the second level. In some implementations, the first differential sub-circuit of the latch and second differential sub-circuit of the latch are electrically coupled to the third shared clock node (SN1 453). In some implementations, the inputs of the first keeper sub-circuit have the same logic polarities compared to the inputs of the first sequence detector, and the inputs of the second keeper sub-circuit have the same logic polarities compared to the inputs of the second sequence detector.

In some implementations, the first keeper sub-circuit is activated in response to (1) the first output of the latch (Y 442) being at a second level, (2) the input signal (D 440) being at a first level, and (3) a main clock signal 101 being at the second level. In some implementations, the second keeper sub-circuit is activated in response to (1) the first output (Y 442) of the latch being at a first level, (2) the input signal (D 440) being at a second level, and (3) a main clock signal 101 being at the second level. Furthermore, both the first keeper sub-circuit and the first sequence detector receive the inverted input signal (Dn 441) and the first output (Y 442) of the latch as inputs, and both the second keeper sub-circuit and the second sequence detector receive the input signal (D 440) and the second output (Yn 443) of the latch as inputs.

Figure 5:
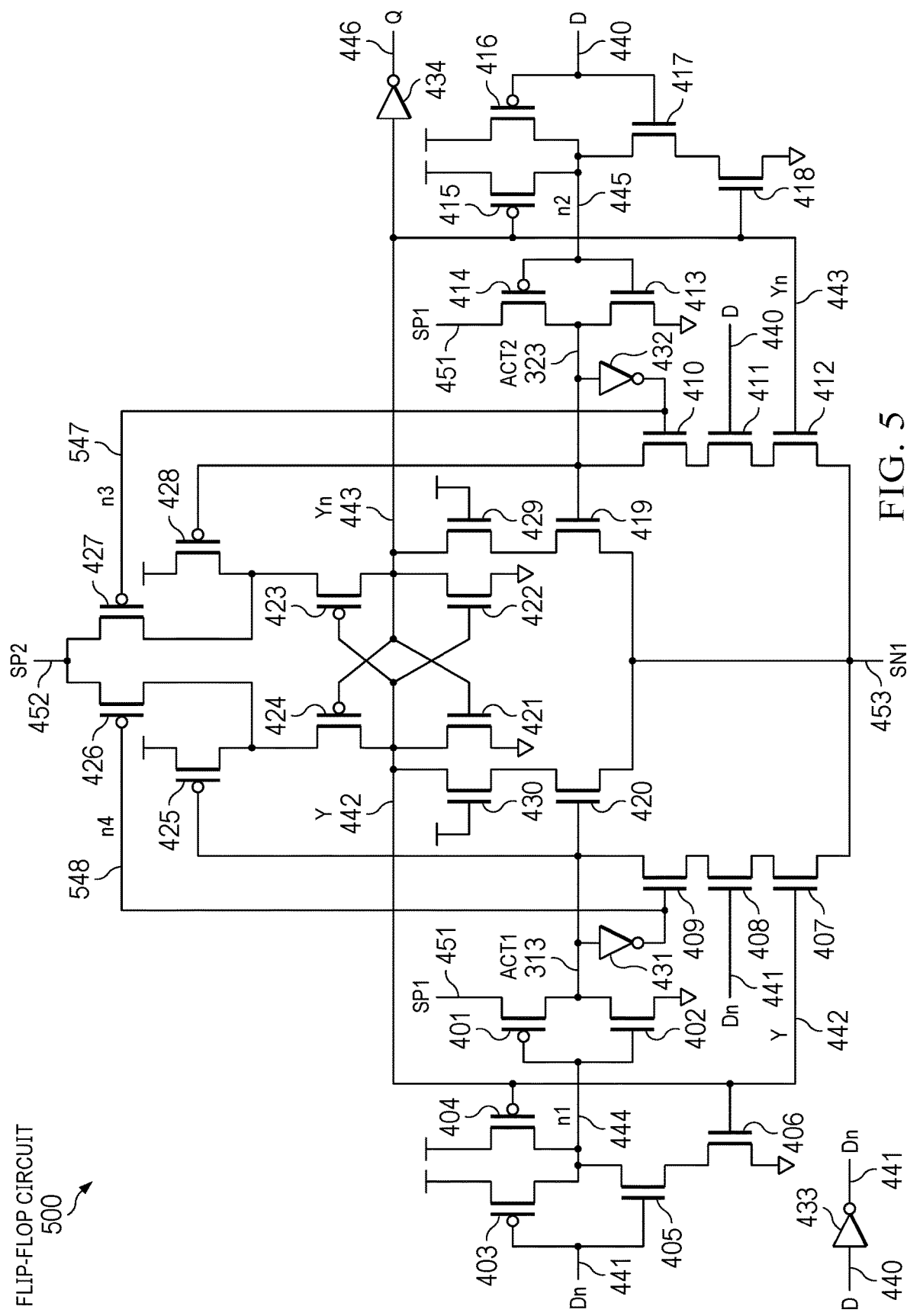
FIG. 5 is a circuit diagram illustrating another flip-flop circuit of FIG. 3 of the compound sequential circuit architecture of FIG. 1, according to an illustrative implementation.

Referring to FIG. 5, a circuit diagram illustrating another flip-flop circuit 500 of FIG. 3 of the compound sequential circuit architecture 100 of FIG. 1, according to an illustrative implementation. In some implementations, the third keeper sub-circuit also can be activated and deactivated by either the first keeper sub-circuit 312 or the second keeper sub-circuit 322, in contrast to FIG. 4 where the third keeper sub-circuit of flip-flop circuit 400 is activated and deactivated by either the first sequence detector 310 or the second sequence detector 320. Flip-flop circuit 500 depicts that the inputs of the third keeper sub-circuit are electrically coupled to the outputs of inverters 431 and 432. In this manner, the third keeper sub-circuit is electrically coupled to the first and second keeper sub-circuits. The gate terminal of transistor 426 is electrically coupled to the output of inverter 431 at node n4 548, and the gate terminal of transistor 427 is electrically coupled to the output of inverter 432 at node n3 547. In this configuration, the activation of the third keeper sub-circuit is delayed until main clock signal 101 transitions to a first level even if the input signal D 440 changes during main clock signal 101 at a second level. Additionally, transistors 425 and 428 cannot be enabled simultaneously with the activation of the third keeper sub-circuit, which further avoids contention. It should be understood that the flip-flop configuration of FIG. 5 has equivalent functionality and performance as flip-flop circuit 400.

Figure 6A:
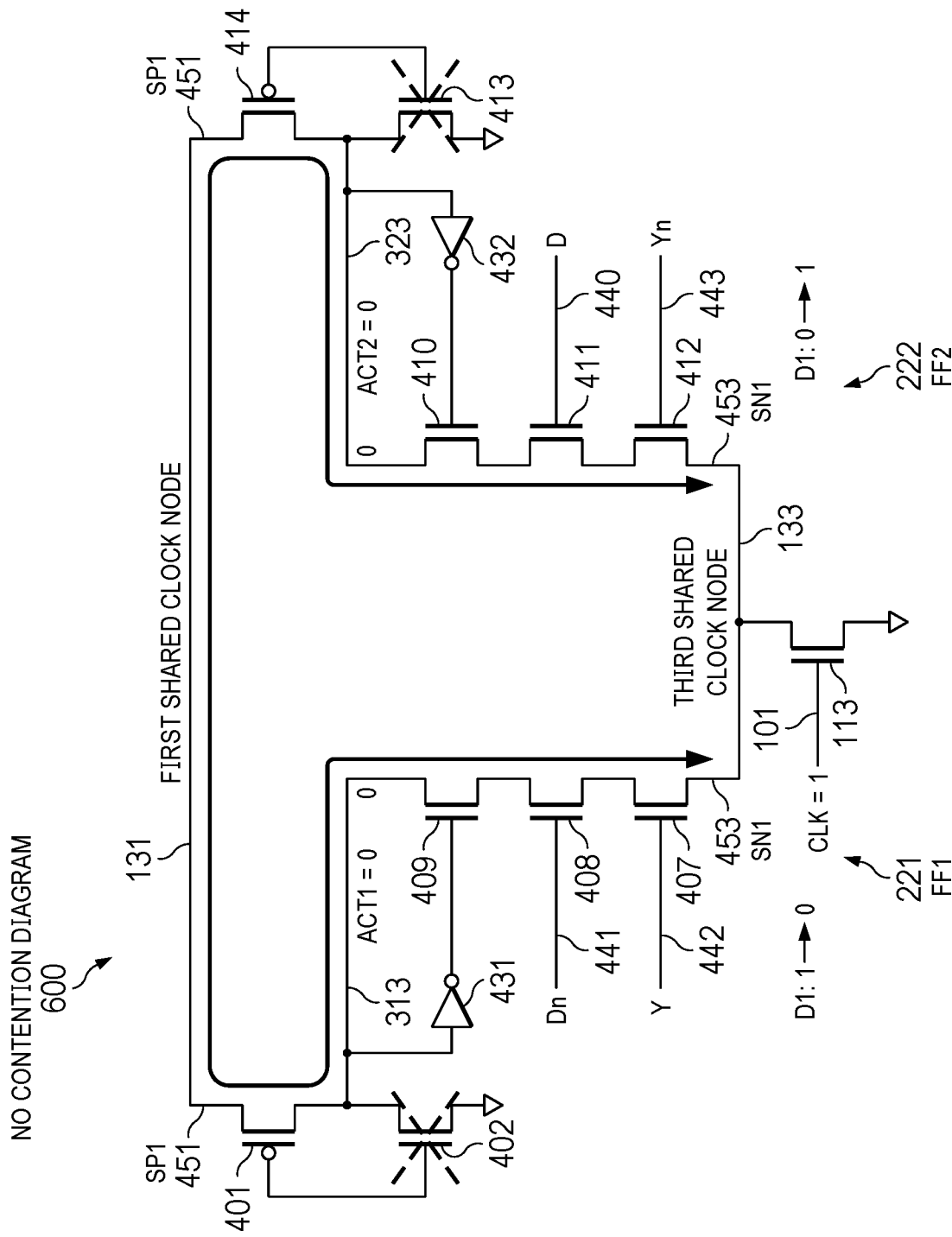
FIGS. 6A-6C are circuit diagrams illustrating contention avoidance of flip-flops of FIG. 4 of the compound sequential circuit architecture of FIG. 1, according to an illustrative implementation.
Figure 6B:
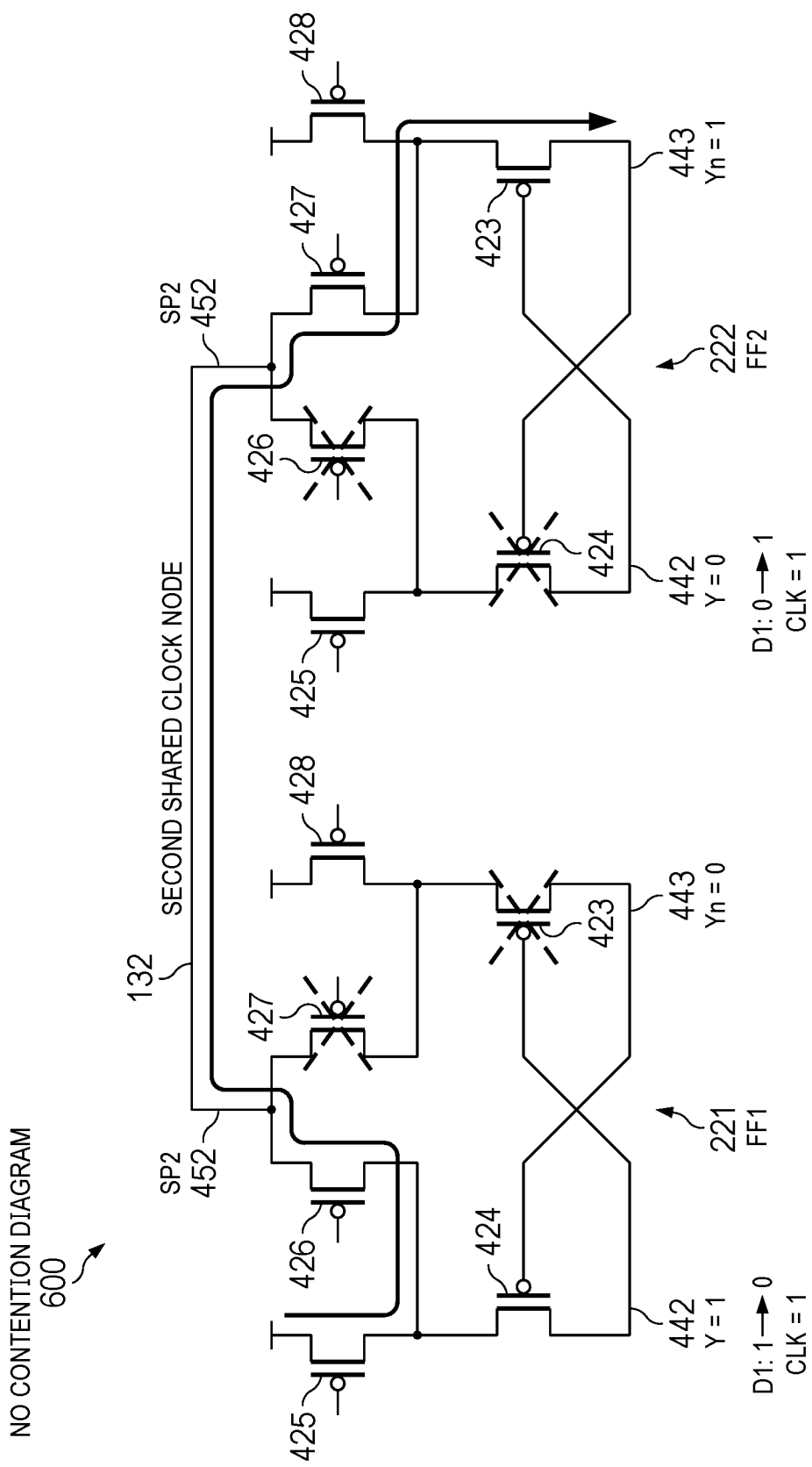
Figure 6C:
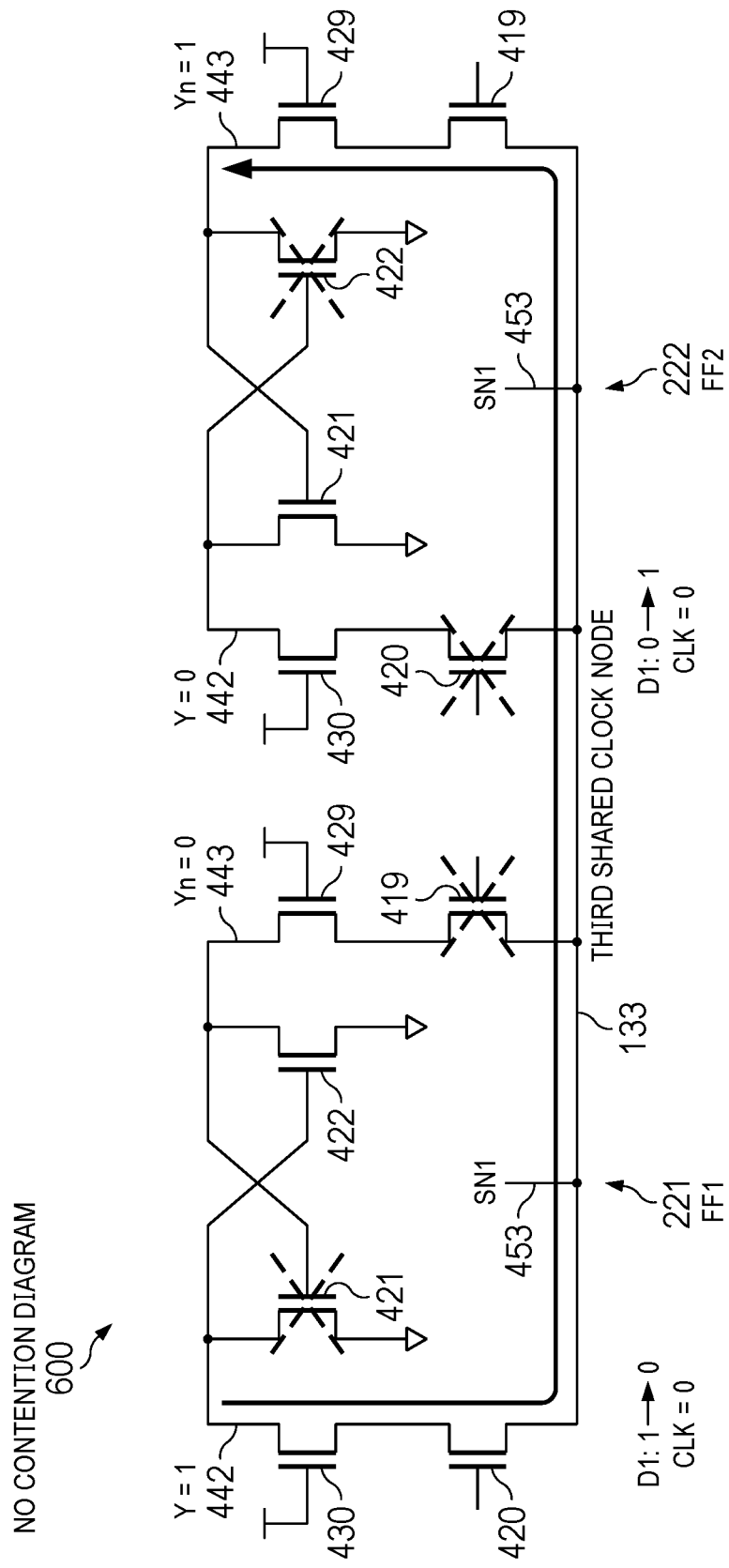

Referring to FIGS. 6A-6C, circuit diagrams illustrating contention avoidance of flip-flop circuits of FIG. 4 of the compound sequential circuit architecture 100 of FIG. 1, according to an illustrative implementation. FIG. 6A depicts the interaction at the first shared clock node 131 for two flip-flops electrically coupled via their first clock terminals SP1 451. FIG. 6B depicts the interaction at the second shared clock node 132 for two flip-flops electrically coupled via their second clock terminals SP2 452. FIG. 6C depicts the interaction at the third shared clock node 133 for two flip-flops electrically coupled via their third clock terminals SN1 453. Therefore, the contention-free operation of compound sequential circuit architecture 100 is discussed using a 4-bit array (N=4). In some implementations, activation of the first sequence detector 310 asserts signal ACT1 313 to activate the first activation transistor 420 in order to pull-down first output Y 442 upon the rising edge of main clock signal 101. Thus, first output Y 442 is at a second level before activation of first sequence detector 310. Likewise, activation of the second sequence detector 320 asserts signal ACT2 323 to activate the second activation transistor 419 in order to pull-down second output Yn 443 upon the rising edge of main clock signal 101. Thus, second output Yn 443 is at a second level before activation of second sequence detector 320.

With reference to the second shared clock node 132 and second clock terminal SP2 452, flip-flop FF1 221 is electrically coupled to flip-flop FF2 222 via second shared clock node 132 as shown in FIG. 6B. In some implementations, each flip-flop has a second clock terminal SP2 452 that also is electrically coupled to the second shared clock node 132, and is further electrically coupled to a third keeper sub-circuit within latch 330. The third keeper sub-circuit is activated in response to a change in the input signal of the associated flip-flop, and is deactivated when the output signal of the associated flip-flop is at the same level as that input signal. For example, the first output Y 442 of flip-flop FF1 221 is at a second level, and second output Yn 443 of flip-flop FF1 221 is at a first level. The first output Y 442 of flip-flop FF2 222 is at a first level and second output Yn 443 of flip-flop FF2 222 is at a second level. Input signal D1 of flip-flop FF1 221 changes from a second level to a first level while main clock signal 101 is at a second level, and transistors 405 and 406 are activated to pull-down node n1 444 to activate transistor 426 of the third keeper sub-circuit within flip-flop FF1 221. Transistor 427 within flip-flop FF1 221 remains inactive as the second sequence detector 320 senses no change in the input signal D1 relative to the second output Yn 443. Transistor 425 remains active during this period and thus a low-impedance path to high-power supply via transistors 426 and 425 exists at the second shared clock node 132. Conversely, input signal D2 of flip-flop FF2 222 changes from a first level to a second level while main clock signal 101 is at a second level, and transistors 417 and 418 are activated to pull-down node n2 445 to activate transistor 427 of the third keeper sub-circuit within flip-flop FF2 222. Transistor 426 within flip-flop FF2 222 remains inactive as the first sequence detector 310 senses no change in the input signal D2 relative to the first output Y 442. As transistor 423 remains active as part of the pull-up network to maintain second output Yn 443 at a second level, the conductive path to high-power supply via transistors 425 and 426 of FF1 221 and transistors 427 and 423 of FF2 222 serves as an additional pull-up network to maintain second output Yn 443 at a second level for flip-flop FF2 222. Therefore, no contention exists between flip-flops FF1 221 and FF2 222 as the voltage polarities are the same throughout this conductive path.

In some implementations, while input signal D1 is at a first level and as main clock signal 101 transitions from a second level to a first level, signal ACT1 313 is asserted, transistor 420 is activated, and transistor 425 is deactivated to interrupt the aforementioned conductive path to high-power supply. Furthermore, while main clock signal 101 is at a first level, signal ACT2 323 of flip-flop FF2 222 is asserted to activate transistor 419 and deactivate transistor 428. With transistor 428 of FF2 222 and transistor 425 of FF1 221 deactivated, no conductive path to high-power supply exists by the time main clock signal 101 transitions from a first level to a second level. Thus, second output Yn 443 of FF2 222 and first output Y 442 of FF1 221 can discharge to low-power supply without any contention. In some implementations, while main clock signal 101 is at a second level and output signals Q1 of FF1 221 and Q2 of FF2 222 settle to the same level as D1 and D2, respectively, transistor 426 of FF1 221 and transistor 427 of FF2 222 are deactivated to completely isolate the second clock terminal SP2 452 of each flip-flop from the other flip-flops within the 4-bit array to avoid any contention.

With reference to the third shared clock node 133 and third clock terminal SN1 453, flip-flop FF1 221 is electrically coupled to flip-flop FF2 222 via third shared clock node 133 as shown in FIG. 6C. Each flip-flop has a third clock terminal SN1 453 that also is electrically coupled to the third shared clock node 133. Third clock terminal SN1 453 is further sub-divided into two linkages: a first linkage that electrically couples the first and second differential sub-circuits of latch 330 to SN1 453, while the second linkage electrically couples the first keeper sub-circuit 312 and second keeper sub-circuit 322 to SN1 453.

For example, with reference to the first linkage, the first output Y 442 of flip-flop FF1 221 is at a second level and second output Yn 443 of flip-flop FF1 221 is at a first level. The first output Y 442 of flip-flop FF2 222 is at a first level and second output Yn 443 of flip-flop FF2 222 is at a second level. Input signal D1 of flip-flop FF1 221 changes from a second level to a first level while main clock signal 101 is at a first level. Signal ACT1 313 is asserted to activate transistor 420 and thereby, enabling the first differential sub-circuit of latch 330. Since input D1 is at the same level as second output Yn 443, signal ACT2 323 remains de-asserted, and the second differential sub-circuit of latch 330 remains disabled. Conversely, input signal D2 of flip-flop FF2 222 changes from a first level to a second level while main clock signal 101 is at a first level. Signal ACT2 323 is asserted to activate transistor 419 and thereby, enabling the second differential sub-circuit of latch 330. Since input D1 is at same level as first output Y 442, signal ACT1 313 remains de-asserted, and the first differential sub-circuit of latch 330 remains disabled. As the first differential sub-circuit of FF1 221 and the second differential sub-circuit of FF2 222 are enabled, a conductive path between flip-flops FF1 221 and FF2 222 via the third shared clock node 133 is formed. This conductive path electrically couples first output Y 442 of FF1 221 to second output Yn 443 of FF2 222. However, as the voltage polarities (e.g., a second level) of both outputs are the same, no contention occurs. Therefore, the flip-flops electrically coupled via third shared clock node 133 within the 4-bit array do not exhibit contention at the third clock terminal SN1 453. Prior to the main clock signal 101 transitioning to a first level, transistors 420 and 419 are deactivated as signals ACT1 313 and ACT2 323 are de-asserted due to the absence of a conductive path to high-power supply via the pull-up network of the first buffer 311 and second buffer 321. This ensures that either the first or second differential sub-circuit is enabled when the main clock signal 101 is at a first level. Therefore, first output Y 442 and second output Yn 443 of one flip-flop are isolated from the first output Y 442 and second output Yn 443 of another flip-flop. By the time main clock signal 101 transitions from a second level to a first level even though the third keeper sub-circuit may be activated, no contention occurs at the first linkage of the third clock terminal SN1 453.

In another example, with reference to the second linkage, the first keeper sub-circuit 312 and the second keeper sub-circuit 322 are electrically coupled also to the third clock terminal SN1 453 within each flip-flop. Only either the first keeper sub-circuit 312 or second keeper sub-circuit 322 can be activated in each flip-flop when the main clock signal 101 is at a second level. Since both keeper sub-circuits are deactivated while the main clock signal 101 is at a first level, the first keeper sub-circuit 312 and second keeper sub-circuit 322 do not pose a risk of contention among flip-flops at the second linkage of the third clock terminal SN1 453.

With reference to the first shared clock node 131 and first clock terminal SP1 451, flip-flop FF1 221 is electrically coupled to flip-flop FF2 222 via first shared clock node 131 as shown in FIG. 6A. Each flip-flop has a first clock terminal SP1 451 that also is electrically coupled to the first shared clock node 131. As mentioned in the second linkage discussion, either the first keeper sub-circuit 312 or second keeper sub-circuit 322 can be active when the main clock signal 101 is at a second level. As input signal D1 of flip-flop FF1 221 changes from a second level to a first level during main clock signal 101 at a second level, the first keeper sub-circuit 312 is activated to maintain signal ACT1 313 at a first level. Furthermore, transistor 401 of the first buffer 311 is activated. Likewise, as input signal D2 of flip-flop FF2 222 changes from a first level to a second level during main clock signal 101 at a second level, the second keeper sub-circuit 322 is activated to maintain signal ACT2 323 at a first level. Also, transistor 414 of the second buffer 321 is activated. A conductive path to low-power supply is provided by transistors 407/408/409/401 from flip-flop FF1 221 and transistors 414/410/411/412 from flip-flop FF2 222 via first clock terminal SP1 451 and third clock-activated transistor 113. Since signal ACT1 313 of flip-flop FF1 221 and signal ACT2 323 of flip-flop FF2 222 are both at a first level while this conductive path to low-power supply is enabled, no contention occurs at the first clock terminal SP1 451. When main clock signal 101 transitions to a first level, the third clock-activated transistor 113 is deactivated to interrupt the pull-down paths of the first keeper sub-circuit 312 from FF1 221 and second keeper sub-circuit 322 from FF2 222. Furthermore, the first and second differential sub-circuits of latch 330 are disabled in both FF1 221 and FF2 222 prior to main clock signal 101 transitioning to a first level. Therefore, signals ACT1 313 from FF1 221 and ACT2 323 from FF2 222 can transition to a second level without any contention from third clock terminal SN1 453.

Figure 7:
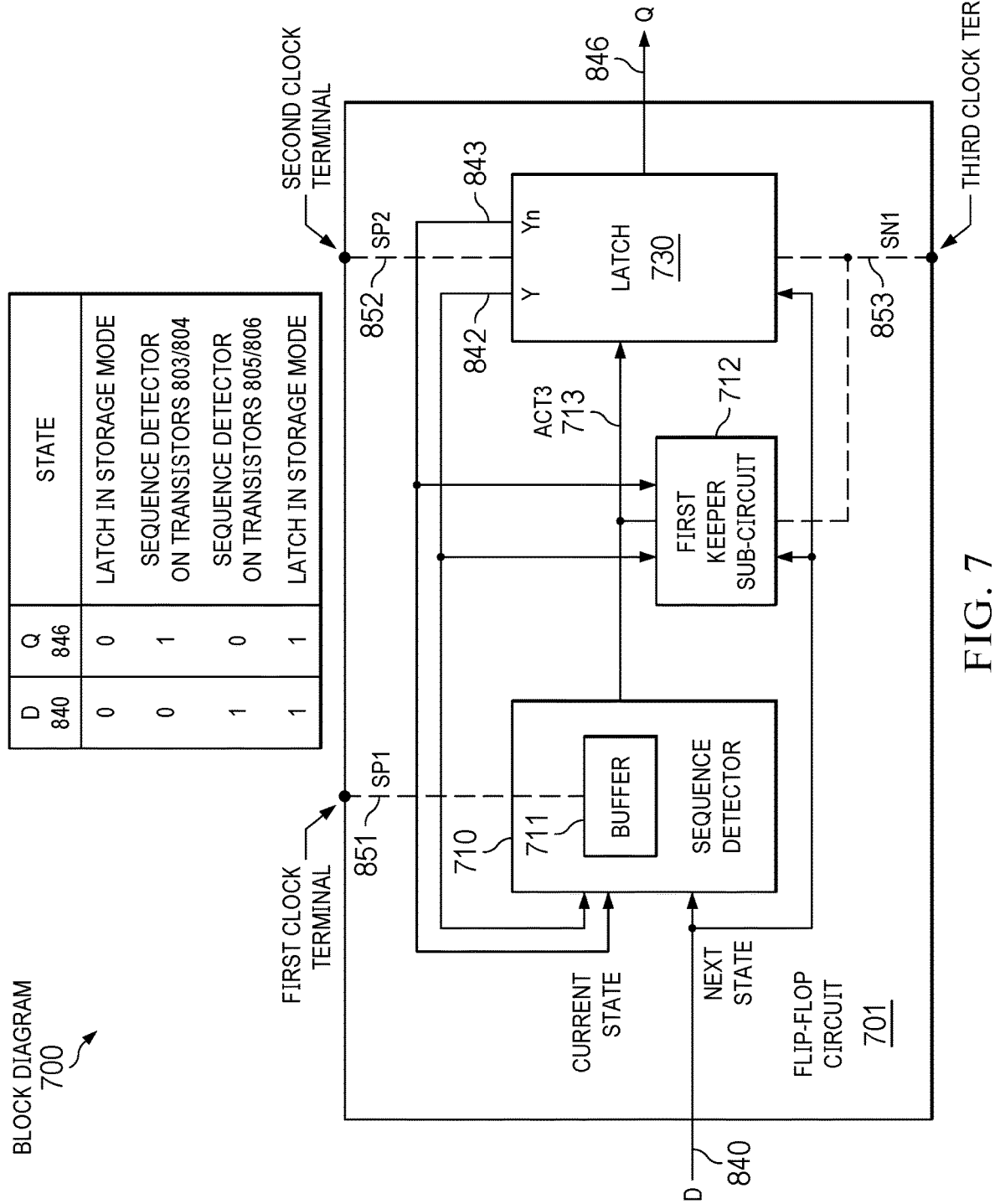
FIG. 7 is a block diagram illustrating another flip-flop circuit of the compound sequential circuit architecture of FIG. 1, according to an illustrative implementation.

FIG. 7 is a block diagram illustrating another flip-flop circuit 701 of the compound sequential circuit architecture 100 of FIG. 1, according to an illustrative implementation. In contrast to FIGS. 3-4 where the architecture of flip-flop circuit 400 employs a first sequence detector 310 to control the first differential sub-circuit and a second sequence detector 320 to control the second differential sub-circuit of latch 330, FIG. 7 illustrates a block diagram of an embodiment that employs only one sequence detector to control both differential sub-circuits of latch 330. The block diagram depicts flip-flop circuit 701 to include a sequence detector 710, a buffer 711, a first keeper sub-circuit 712, and a latch 730. As shown, buffer 711 is part of sequence detector 710. In some implementations, latch 730 is also a differential latch with a first differential sub-circuit and a second differential sub-circuit. In particular, the first differential sub-circuit receives the inverted input signal Dn 841 and the second differential sub-circuit receives the input signal D 840. Latch 730 can also include a first output Y 842 and second output Yn 843. In some implementations, the sequence detector 710 is electrically coupled to the first and second differential sub-circuits of latch 730, and further electrically coupled to the first keeper sub-circuit 712. Additionally, as shown the input signal D 840 is electrically coupled to (1) the second differential sub-circuit of latch 730, (2) the sequence detector 710, (2) the first keeper sub-circuit 712, and (4) a second keeper sub-circuit within latch 730. Moreover, as shown the inverted input signal Dn 841 is electrically coupled to (1) the first differential sub-circuit of latch 730, (2) the sequence detector 710, (3) the first keeper sub-circuit 712, and (4) the second keeper sub-circuit within latch 730. In some implementations, the first output Y 842 and second output Yn 843 are electrically coupled to the sequence detector 710 and to the first keeper sub-circuit 712 and output signal Q 846 is the output of flip-flop circuit 701 and is electrically coupled to latch 730.

Figure 8:
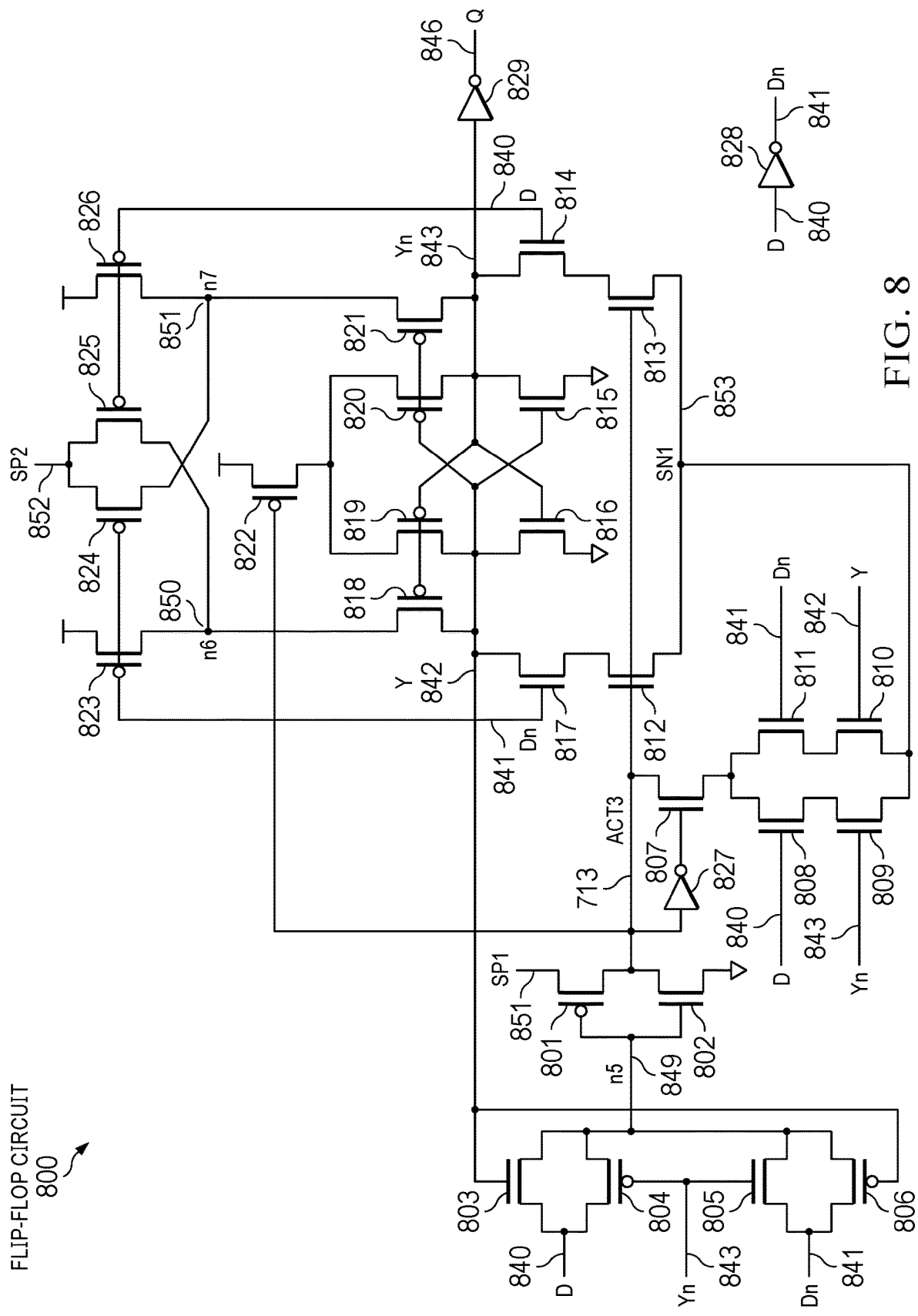
FIG. 8 is a circuit diagram illustrating a flip-flop circuit of FIG. 7 of the compound sequential circuit architecture of FIG. 1, according to an illustrative implementation.

Referring now to FIG. 8, a circuit diagram illustrating a flip-flop of FIG. 7 of the compound sequential circuit architecture of FIG. 1, according to an illustrative implementation. In general, FIG. 8 discloses a flip-flop circuit 800 to implement the architecture illustrated in FIG. 7. Additionally, the flip-flop circuit 800 similarly does not include any clock-activated transistors but instead includes a first clock terminal SP1 851, a second clock terminal SP2 852, and a third clock terminal SN1 853. In some implementations, buffer 711 is electrically coupled to the first clock terminal SP1 851 and latch 730 is electrically coupled to second clock terminal SP2 852 and to the third clock terminal SN1 853. The second keeper sub-circuit within latch 730 is electrically coupled to second clock terminal SP2 852 and the first keeper sub-circuit 712 is electrically coupled to the third clock terminal SN1 853. The first differential sub-circuit of latch 730 is electrically coupled to the second differential sub-circuit of latch 730 via third clock terminal SN1 853. Consequently, the first and second differential sub-circuits of latch 730 are electrically coupled to the first keeper sub-circuit 712.

As the first output Y 842, second output Yn 843, and input signal D 840 are electrically coupled to the sequence detector 710, the current state from latch 730 and the next state from input signal D 840 can be monitored every clock cycle. If the next state and the current state are at the same level, latch 730 is in storage mode and maintains the output signal Q 846 at current level. Hence sequences D=1, Q=1 and D=0, Q=0 instruct sequence detector 710 to de-assert signal ACT3 713 and latch 730 enters into storage mode retaining the level of output signal Q 846. For example, if first output Y 842 is at a second level and input signal 840 transitions to a first level or if first output Y 842 is at a first level and input signal 840 transitions to a second level, sequence detector 710 is enabled to assert signal ACT3 713 (e.g., second level) when the main clock signal 101 is at a first level. Thus, sequence detector 710 responds to both sequences D=0, Q=1 and D=1, Q=0. If sequence D=0, Q=1 is detected, the first differential sub-circuit of latch 730 is enabled and if sequence D=1, Q=0 is detected, the second differential sub-circuit of latch 730 is enabled. Upon detection of either sequence, the sequence detector 710 can assert signal ACT3 713 when the main clock signal 101 is at a first level. Each branch of the first and second differential sub-circuits includes an activation transistor that can be enabled by signal ACT3 713. The first and second differential sub-circuits of latch 730 also are input-gated, and the level of input signal D 840 determines which differential sub-circuit is enabled. It should be understood that an equivalent AND function is applied to the input signal D 840 and signal ACT3 713 in determining whether the first or the second differential sub-circuit is enabled. The truth table shown in FIG. 7 summarizes the operating mode of latch 730 based on which sequence is detected.

The circuit elements including flip-flop circuit 800 is now described. The sequence detector 710 includes transistors 803, 804, 805, 806 and buffer 711, which includes transistors 801 and 802. Transistor 802 is the pull-down transistor of buffer 711. The first keeper sub-circuit 712 includes transistors 807, 808, 809, 810, 811, and inverter 827. Latch 730 includes transistors 812-826. Transistors 812 and 817 include the first differential sub-circuit of latch 730, and transistors 813 and 814 include the second differential sub-circuit of latch 730. Transistors 812 and 813 are the two activation transistors. Transistors 824 and 825 are components of the second keeper sub-circuit within latch 730. Input signal D 840 is electrically coupled to the input of inverter 828 to generate the inverted input signal Dn 841. The second output Yn 843 of latch 730 is electrically coupled to the input of inverter 829 to generate the output signal Q 846. Inverter 829 is an isolation buffer to isolate the output signal 846 from the internal nodes of flip-flop circuit 800.

The connectivity of flip-flop circuit 800 is now described. For the sequence detector 710, the drain terminals of transistors 803 and 804 are electrically coupled to the input signal D 840. The drain terminals of transistors 805 and 806 are electrically coupled to the inverted input signal Dn 841. The source terminals of transistors 803, 804, 805, and 806 are electrically coupled to node n5 849. The gate terminals of transistors 804 and 805 are electrically coupled to the second output Yn 843, and the gate terminals of transistors 803 and 806 are electrically coupled to the first output Y 842. The gate terminals of transistors 801 and 802 are electrically coupled also to node n5 849, and the drain terminals are electrically coupled to signal ACT3 713. Node n5 849 and signal ACT3 713 are the input and output of buffer 711, respectively. The source terminal of transistor 801 is electrically coupled to the first clock terminal SP1 851, and the source terminal of transistor 802 is electrically coupled to low-power supply.

With reference to the first keeper sub-circuit 712, signal ACT3 713 is electrically coupled to the input of inverter 827 and also electrically coupled to the drain terminal of transistor 807. The gate terminal of transistor 807 is electrically coupled to the output of inverter 827, and the source terminal is electrically coupled to the drain terminals of transistors 808 and 811. The source terminal of transistor 808 is electrically coupled to the drain terminal of transistor 809. The gate terminal of transistor 808 is electrically coupled to the input signal D 840, and the gate terminal of transistor 809 is electrically coupled to the second output Yn 843. The source terminal of transistor 811 is electrically coupled to the drain terminal of transistor 810. The gate terminal of transistor 811 is electrically coupled to the inverted input signal Dn 841, and the gate terminal of transistor 810 is electrically coupled to the first output Y 842. The source terminals of transistors 809 and 810 are electrically coupled to the third clock terminal SN1 853. It should be understood that the order of transistors 808 and 809 can be interchanged, and the order of transistors 811 and 810 can be interchanged without impacting functionality or performance. Likewise, transistor 807 also can be reordered within the pull-down stack of first keeper sub-circuit 712.

With reference to latch 730, transistors 817 and 812 of the first differential sub-circuit are electrically coupled in-series. The drain terminal of transistor 817 is electrically coupled to the first output Y 842, and the gate terminals of transistors 817, 823, and 824 are electrically coupled to the inverted input signal Dn 841. The gate terminal of transistor 812 is electrically coupled to signal ACT3 713, and the source terminal is electrically coupled to the third clock terminal SN1 853. Transistors 814 and 813 of the second differential sub-circuit are electrically coupled in-series. The drain terminal of transistor 814 is electrically coupled to the second output Yn 843, and the gate terminals of transistors 814, 826, and 825 are electrically coupled to the input signal D 840. The gate terminal of transistor 813 is electrically coupled to signal ACT3 723, and the source terminal is electrically coupled to the third clock terminal SN1 853. In this manner, the first and second differential sub-circuits of latch 730 also are electrically coupled to the first keeper sub-circuit via the third clock terminal SN1 853. Transistors 819 and 816 form a cross-coupled pair with transistors 820 and 815. The gate terminals of transistors 819 and 816 are electrically coupled to the drain terminals (also referred to herein as "second output Yn 843") of transistors 820 and 815. Likewise, the gate terminals of transistors 820 and 815 are electrically coupled to the drain terminals (also known as first output Y 842) of transistors 819 and 816. The source terminals of transistors 816 and 815 are electrically coupled to low-power supply, and the source terminals of transistors 819 and 820 are electrically coupled to the drain terminal of transistor 822. The source terminal of transistor 822 is electrically coupled to high-power supply, and the gate terminal is electrically coupled to signal ACT3 713. The drain terminal of transistor 818 is electrically coupled to the first output Y 842, and the gate terminal is electrically coupled to second output Yn 843. The drain terminal of transistor 821 is electrically coupled to the second output Yn 843, and the gate terminal is electrically coupled to the first output Y 842. The source terminal of transistor 821 is electrically coupled to second intermediate node n7 851, and the source terminal of transistor 818 is electrically coupled to first intermediate node n6 850. The drain terminals of transistors 824 and 825 from the second keeper sub-circuit are electrically cross-coupled to second intermediate node n7 851 and first intermediate node n6 850, respectively. The source terminals of transistors 824 and 825 are electrically coupled to the second clock terminal SP2 852. The drain terminal of transistor 823 is electrically coupled to first intermediate node n6 850, and the drain terminal of transistor 826 is electrically coupled to second intermediate node n7 851. The source terminals of transistors 823 and 826 are electrically coupled to high-power supply.

The operation of flip-flop circuit 800 is described now in detail. As shown in the truth table of FIG. 7 when both input signal D 840 and output signal Q 846 are at the same level, latch 730 is in storage mode. Transistors 823, 818, and 816 form an inverter-like cross-coupled pair with transistors 826, 821, and 815 to retain the current levels of first output Y 842 and second output Yn 843. For example, when input signal D 840 is constant, sequence detector 710 charges node n5 849 to a second level to activate transistor 802. Signal ACT3 713 is de-asserted (e.g., first level) to disable the first and second differential sub-circuits of latch 730 by deactivating transistors 812 and 813. If first output Y 842 is at a first level and second output Yn 843 is at a second level, transistors 816 and 821 are activated. The first output Y 842 at a first level implies that input signal D 840 is also at a first level and thus, transistor 826 is activated. Transistor 816 maintains first output Y 842 at a first level every clock cycle, and transistors 821 and 826 maintain second output Yn 843 at a second level every clock cycle. Additionally, second output Yn 843 is maintained at a second level further by transistors 820 and 822 because transistor 820 mirrors transistor 821, and transistor 822 is activated by signal ACT3 713 at a first level. It should be understood that as signal ACT3 713 is held at a first level by transistor 802, transistor 807 of the first keeper sub-circuit 712 is activated; however, transistors 808 and 810 are deactivated to prevent the pull-down network from activation. Conversely if first output Y 842 is at a second level and second output Yn 843 is at a first level, transistors 815 and 818 are activated. The first output Y 842 at a second level implies that input signal D 840 is also at a second level and thus, transistor 823 is activated. Transistor 815 maintains second output Yn 843 at a first level every clock cycle, and transistors 818 and 823 maintain first output Y 842 at a second level every clock cycle. Additionally, first output Y 842 is maintained at a second level further by transistors 819 and 822 because transistor 819 mirrors transistor 818, and transistor 822 is activated by signal ACT3 713 at a first level. In this first and second output combination, transistors 809 and 811 are deactivated to prevent the pull-down network of the first keeper sub-circuit 712 from activation.

For example, if the sequence D=0 and Q=1 is detected (e.g., input signal D 840 transitions from a second level to a first level and output signal Q 846 is at a second level) while main clock signal 101 is at a first level, transistors 803 and 804 are activated to discharge node n5 849 to low-power supply. Transistor 801 is activated to provide a conductive path to high-power supply via first clock-activated transistor 111, and signal ACT3 713 is asserted to activate the two activation transistors 812 and 813. Since input signal D 840 is at a first level, transistor 817 is activated while transistor 814 is deactivated and thereby, the first differential sub-circuit of latch 730 is enabled and the second differential sub-circuit of latch 730 is disabled. When main clock signal 101 transitions to a second level, the third clock-activated transistor 113 discharges the third clock terminal SN1 853 to pull-down first output Y 842 to low-power supply. Transistors 821 and 826 are activated to charge second output Yn 843 to a second level. Isolation buffer 829 generates the new output signal Q 846 at a first level. When the first output Y 842 is at same level as the input signal D 840 (e.g., first level), transistors 805 and 806 of the sequence detector 710 are activated to charge node n5 849 to a second level, thereby activating the pull-down transistor 802 of buffer 711. Signal ACT3 713 is de-asserted to deactivate the two activation transistors 812 and 813, thereby, disabling both the first and second differential sub-circuits of latch 730 while main clock signal 101 is at a second level. Latch 730 enters into the storage mode state as described herein.

In another example, if the sequence D=1 and Q=0 is detected (e.g., input signal D 840 transitions from a first level to a second level and output signal Q 846 is at a first level) while main clock signal 101 is at a first level, transistors 805 and 806 are activated to discharge node n5 849 to low-power supply. Transistor 801 is activated to provide a conductive path to high-power supply via first clock-activated transistor 111, and signal ACT3 713 is asserted to activate the two activation transistors 812 and 813. Since input signal D 840 is at a second level, transistor 814 is activated while transistor 817 is deactivated and thereby, the second differential sub-circuit of latch 730 is enabled and the first differential sub-circuit of latch 730 is disabled. When main clock signal 101 transitions to a second level, the third clock-activated transistor 113 discharges the third clock terminal SN1 853 to pull-down second output Yn 843 to low-power supply. Transistors 818 and 823 are activated to charge first output Y 842 to a second level. Isolation buffer 829 generates the new output signal Q 846 at a second level. When the first output Y 842 is at same level as the input signal D 840 (e.g., second level), transistors 803 and 804 of the sequence detector 710 are activated to charge node n5 849 to a second level, thereby activating the pull-down transistor 802 of buffer 711. Signal ACT3 713 is de-asserted to deactivate the two activation transistors 812 and 813, thereby, disabling both the first and second differential sub-circuits of latch 730 while main clock signal 101 is at a second level. Latch 730 enters into storage mode as previously described.

When input signal D 840 is constant across many clock cycles, transistor 802 is continuously activated to de-assert signal ACT3 713, and thereby both first and second differential sub-circuits of latch 730 are disabled. When there is no input activity, all the internal nodes of flip-flop circuit 800 do not toggle, and flip-flop circuit 800 does not consume any dynamic power. However, should the input signal D 840 change while main clock signal 101 is at a second level, the first keeper sub-circuit 712 is activated. Activation of the first keeper sub-circuit 712 automatically deactivates the pull-down transistor 802 of buffer 711 because changes to the input signal D 840 result in discharging node n5 849 to a first level. Furthermore, if either transistor pair 808/809 or 810/811 is activated, transistor 801 of buffer 711 is also activated. Consequently, signal ACT3 713 is maintained at a first level by only the first keeper sub-circuit 712 if input signal D 840 changes while main clock signal 101 is at a second level. In some implementations, because the architecture of flip-flop circuit 800 requires the pull-down transistor of buffer 711 to be deactivated upon activation of the first keeper sub-circuit 712, contention at the three clock terminals is avoided when multiple flip-flops are electrically coupled together within the N-bit array.

The following example provides further details on the operation of the first keeper sub-circuit 712. For example, if sequence D=0, Q=1 or D=1, Q=0 is detected while main clock signal 101 is at a second level, transistor 802 is deactivated as node n5 849 is at a first level. Transistor 801 is activated; however, no conductive path to high-power supply exists at signal ACT3 713 while main clock signal 101 is at a second level. Therefore, signal ACT3 713 is maintained at a first level by the pull-down network of transistors 807-811. Third clock terminal SN1 853 is already discharged to low-power supply by the third clock-activated transistor 113. Transistor 807 is activated by the output of inverter 827 at a second level. For sequence D=0 and Q=1, transistors 810 and 811 are activated. For sequence D=1 and Q=0, transistors 808 and 809 are activated. Signal ACT3 713 is maintained at a first level by either transistors 807/808/809 or transistors 807/811/810 when main clock signal 101 is at a second level. As signal ACT3 713 is de-asserted, activation transistors 812 and 813 remain deactivated to disable both the first and second differential sub-circuits of latch 730. Hence it is shown that when the first keeper sub-circuit 712 is activated, the first and second differential sub-circuits must be disabled. This behavior of the first keeper sub-circuit 712 is fundamental to preventing contention at the three clock terminals when multiple flip-flops are electrically coupled together within the N-bit array.

In some implementations, when main clock signal 101 transitions from a second level to a first level, the third clock-activated transistor 113 is deactivated and the conductive path to low-power supply of the first keeper sub-circuit 712 is interrupted. A conductive path to high-power supply is established via transistor 801 and first clock-activated transistor 111 to charge signal ACT3 713 to a second level without contention from the first keeper sub-circuit 712. As both first and second differential sub-circuits of latch 730 are disabled initially, first output Y 842 and second output Yn 843 are decoupled from signal ACT3 713, and thus, they do not interfere with the transition of signal ACT3 713 to a second level, which deactivates transistor 807 to complete the deactivation of first keeper sub-circuit 712. Deactivating transistor 807 is sufficient to deactivate the first keeper sub-circuit 712 despite transistors 808/809 or transistors 810/811 being activated.

In some implementations, should input signal D 840 and inverted input signal Dn 841 change while main clock signal 101 is at a first level, the first and second outputs of latch 730 must remain stable for flip-flop circuit 800 to have a fully static operation. If first output Y 842 is at a first level and second output Yn 843 is at a second level, transistors 821 and 826 are activated to maintain second output Yn 843 at a second level. If input signal D 840 changes from a first level to a second level during clock at a first level, transistor 826 is deactivated, and the conductive path to high-power supply at second output Yn 843 is interrupted. To avoid a floating second output Yn 843, a second keeper sub-circuit including of transistors 824 and 825 is implemented within latch 730 to restore a conductive path to high-power supply via the second clock-activated transistor 112. The drain terminals of transistors 824 and 825 are cross-coupled to intermediate nodes of the two pull-up branches, one of which is the interrupted path, to form an alternative conductive path to high-power supply. The drain terminal of transistor 824 is electrically coupled to the second intermediate node n7 851 while the gate terminal is electrically coupled to the inverted input signal Dn 841. The drain terminal of transistor 825 is electrically coupled to the first intermediate node n6 850 while the gate terminal is electrically coupled to input signal D 840. As transistor 826 is deactivated, transistor 824 is activated to form the alternative path to high-power supply via transistors 821, 824, and 112 for second output Yn 843 to remain at a second level. Conversely if first output Y 842 is at a second level and second output Yn 843 is at a first level and input signal D 840 changes from a second level to a first level during clock at a first level, transistor 825 is activated to form an alternative path to high-power supply via transistors 818, 825, and 112 for first output Y 842 to remain at a second level. The second keeper sub-circuit ensures a fully static operation for latch 730 should the input signal D 840 change while main clock signal 101 is at a first level.

Likewise, in some implementations, should input signal D 840 and inverted input signal Dn 841 change while main clock signal 101 is at a second level, the first and second outputs of latch 730 must remain stable for flip-flop circuit 800 to have a fully static operation. If first output Y 842 is at a first level and second output Yn 843 is at a second level, transistors 821 and 826 are activated to maintain second output Yn 843 at a second level. Transistor 816 maintains first output Y 842 at a first level as signal ACT3 713 already has deactivated activation transistors 812 and 813 to disable the first and second differential sub-circuits of latch 730. If input signal D 840 changes from a first level to a second level, transistor 826 is deactivated. Because the gate terminals of transistors 820 and 821 are electrically coupled together, transistor 820 also is activated. As signal ACT3 713 is at a first level, transistor 822 is activated to provide an additional conductive path to high-power supply via transistors 820 and 822 for second output Yn 843 to remain at a second level. Conversely, if first output Y 842 is at a second level and second output Yn 843 is at a first level, transistors 819 and 822 provide an additional conductive path to high-power supply for first output Y 842 to remain at a second level after transistor 823 has been deactivated upon input signal D 840 changing from a second level to a first level. Transistors 819, 820, and 822 ensure a fully static operation for latch 730 should the input signal D 840 change while main clock signal 101 is at a second level.

In some implementations, when the input signal D 840 has changed prior to the rising edge of clock signal 101, first output Y 842 or second output Yn 843 is discharged to low-power supply based on the level of the new input signal D 840. Despite the second keeper sub-circuit being activated during the discharging of first output Y 842 or second output Yn 843, there are no contention issues from transistors 824 and 825 because the second clock-activated transistor 112 is deactivated. Due to the cross-coupling of the drain terminals of transistors 824 and 825, no conductive path to high-power supply will contend with the discharging of first or second output node. Thus, the second keeper sub-circuit does not interfere with the pull-down networks of the first and second differential sub-circuits of latch 730 and is not a source that can contribute contention when multiple flip-flops are electrically coupled together within the N-bit array.

With reference to the interactions between flip-flops at the shared clock nodes for flip-flop circuit 800. The exemplary flip-flops FF1 221 to FF4 224 in the 4-bit compound sequential circuit 220 of FIG. 2 use the embodiment of FIG. 8 in the following discussion, which details the interactions between two flip-flops at the second shared clock node 132 and illustrates how contention is avoided. The following example uses these conditions: the input signal D 840 is constant, the first output Y 842 is at a second level, and the main clock signal 101 is at a second level. Transistors 825, 826, 821, and 820 are deactivated while transistors 822, 823, 824, 818, and 819 are activated. Any escape route from one flip-flop to another flip-flop via second clock terminal SP2 852 must traverse transistors 824 or 825. However, the following paths bridging high-power supply to second clock terminal SP 852 within one flip-flop are disabled; transistors 823 and 825; transistors 822, 819, 818, and 825; transistors 826 and 824; transistors 822, 820, 821, 824. These paths are disabled due to at least one transistor being deactivated when the input signal D 840 is constant for each flip-flop and therefore, no contention occurs at the second clock terminal SP2 852 as all conductive paths from one flip-flop to another flip-flop via the second shared clock node 132 are disabled.

For example, if the input signal D 840 changes within multiple flip-flops, a path from one flip-flop to another flip-flop via the second shared clock node 132 can exist. The following illustration discusses in detail the interaction between two flip-flops under this condition. The first output Y 842 of FF1 221 is at a second level while main clock signal 101 is at a second level and input signal D1 changes from a second level to a first level. Signal ACT3 713 is at a first level and disables the first and second differential sub-circuits of latch 730 within flip-flop FF1 221. An escape route from high-power supply to second clock terminal SP2 852 is formed by transistors 822, 819, 818, and 825 within flip-flop FF1 221. Now the second output Yn 843 of FF2 222 is at a second level while main clock signal 101 is at a second level and input signal D2 changes from a first level to a second level. Signal ACT3 713 also is at a first level and disables the first and second differential sub-circuit of latch 730 within flip-flop FF2 222. An escape route from high-power supply to second clock terminal SP2 852 is formed by transistors 822, 820, 821, and 824 within flip-flop FF2 222. The escape route from flip-flop FF1 221 electrically couples to the escape route from flip-flop FF2 222 via the second shared clock node 132. However, both escape routes only couple the high-power supply of flip-flop FF1 221 to the high-power supply of flip-flop FF2 222 and thus, pose little (or no) risk of contention. It should be understood that whichever first output Y 842 node or second output Yn 843 node is maintained at a first level, the two pull-up transistors electrically coupled to that node are deactivated. For example, if the node of first output Y 842 is at a first level, transistors 818 and 819 are deactivated. Conversely if the node of second output Yn 843 is at a first level, transistors 820 and 821 are deactivated. The two inactive transistors effectively block any pull-up paths from contending with the first output Y 842 or second output Yn 843 that can be at a first level.

In some implementations, as the main clock signal 101 transitions from a second level to a first level, signals ACT3 713 of both flip-flops FF1 221 and FF2 222 are asserted in response to the change in input signals D1 and D2, respectively. Transistor 822 becomes deactivated in both flip-flops, and second clock-activated transistor 112 becomes activated to complete the second keeper sub-circuit (transistors 824 and 825) in maintaining the first output Y 842 of flip-flop FF1 221 and the second output Yn 843 of flip-flop FF2 222 at a second level. Deactivating transistor 822 in both flip-flops disable the only path to high-power supply. Moreover when the main clock signal 101 transitions to a second level to pull-down both the first output Y 842 of flip-flop FF1 221 and the second output Yn 843 of flip-flop FF2 222, there is no contention with any pull-up paths to high-power supply from the pull-up networks of latch 730 within flip-flops FF1 221 and FF2 222 because transistors 822 and 112 are deactivated. Those skilled in the art can perform similar analysis at the first shared clock node 131 and third shared clock node 133 to show a lack of contention for flip-flop circuit 800.

In some implementations, to reduce voltage drop a series-coupled transistor can be inserted between second output Yn 843 and third clock terminal SN1 853. In particular, the presence of two activation transistors (812 for first differential sub-circuit and 813 for second differential sub-circuit) can accomplish this goal by further separating the node of second output Yn 843 from the node of third clock terminal SN1 853. Now second output Yn 843 shares less charge due to a smaller capacitance at the source terminal of transistor 814 and drain terminal of transistor 813 when transistor 814 is activated while main clock signal 101 is at a first level. The presence of two activation transistors 812 and 813 has additional benefit of reducing the cross-over current between first output Y 842 and second output Yn 843 when both transistors 817 and 814 are simultaneously activated momentarily during the switching of input signal D 840 and inverted input signal Dn 841. This cross-over current can cause a more pronounced voltage drop at the second output Yn 843.

In some implementations, to reduce the magnitude of a voltage drop, a second reduction transistor 429 is inserted between second output Yn 443 and transistor 419. Similarly, a first reduction transistor 430 is inserted between first output Y 443 and transistor 420 to reduce the magnitude of the voltage droop at first output Y 443 when transistor 420 is activated in response to input signal D 440 changing to a first level. In some implementations, the node of second output Yn 443 is further separated from the node of third clock terminal SN1 453, therefore less charge sharing occurs due to a smaller capacitance at the source terminal of transistor 429 and drain terminal of transistor 419 when transistor 419 is activated while main clock signal 101 is at a first level. Hence the role of reduction transistors 430 and 429 is to reduce the voltage droop at first output Y 442 and second output Yn 443, respectively, due to charge sharing. Both reduction transistors 430 and 429 can be optional and can be implemented depending on the severity of the charge sharing for a given process technology. In some configurations of multiple flip-flops electrically coupled together within the N-bit array, the aggregate capacitance at the third shared clock node 133 is still large despite the presence of reduction transistors within each flip-flop. Under these circumstances, various embodiments are disclosed to further reduce the capacitance at the third clock terminal SN1 453.

In some implementations, the first sequence detector includes the first buffer and electrically couples to the first output of the latch, the second output of the latch, an input signal, and an inverted input signal. In particular, the first sequence detector is configured to activate a first transistor 812 and a second transistor 813 in response to (1) the input signal is the opposite logic polarity compared to the first output of the latch when a main clock signal is at a first level, or (2) the first transistor and the second transistor are deactivated when the main clock signal is at a second level. In some implementations, activating the first transistor and the second transistor when the main clock signal is at the first level activates the latch to capture a data bit from the input signal and to generate an output signal based on a level of the captured data bit when the main clock signal transitions from the first level to the second level.

In some implementations, the first keeper sub-circuit is activated in response to a change in the input signal that is the opposite logic polarity compared to the first output of the latch when a main clock signal is at a second level, and when the first keeper sub-circuit is activated, a pull-down transistor of the first buffer is deactivated, the first transistor is deactivated and the second transistor is deactivated. In some implementations, the first keeper sub-circuit is configured to receive, as inputs, the first output of the latch, the second output of the latch, the input signal, and the inverted input signal, and wherein the latch further includes at least a first intermediate node and a second intermediate node, and at least the first transistor and the second transistor configured to be activated simultaneously by the output of the first buffer, where the first transistor and the second transistor are electrically coupled to the third shared clock node. In some implementations, with reference to FIG. 12, the first keeper sub-circuit includes an inverter feedback loop at a bottommost position of a pull-down network, wherein the pull-down network includes a third transistor 808, a fourth transistor 809, a fifth transistor 811, a sixth transistor 810 and the inverter feedback loop, and wherein inverter feedback loop includes an inverter 827 and a seventh transistor 807, and wherein the seventh transistor of the inverter feedback loop is electrically coupled to the third shared clocked node (SN1 853).

In some implementations, a second keeper sub-circuit is electrically coupled to an input signal and an inverted input signal, and the second keeper sub-circuit is activated in response to a change in the input signal when a main clock signal being at a first level. In some implementations, the second keeper sub-circuit is electrically coupled to the second shared clock node, and the second keeper sub-circuit is electrically cross-coupled to a first intermediate node of the latch and a second intermediate node of the latch.

Figure 9:
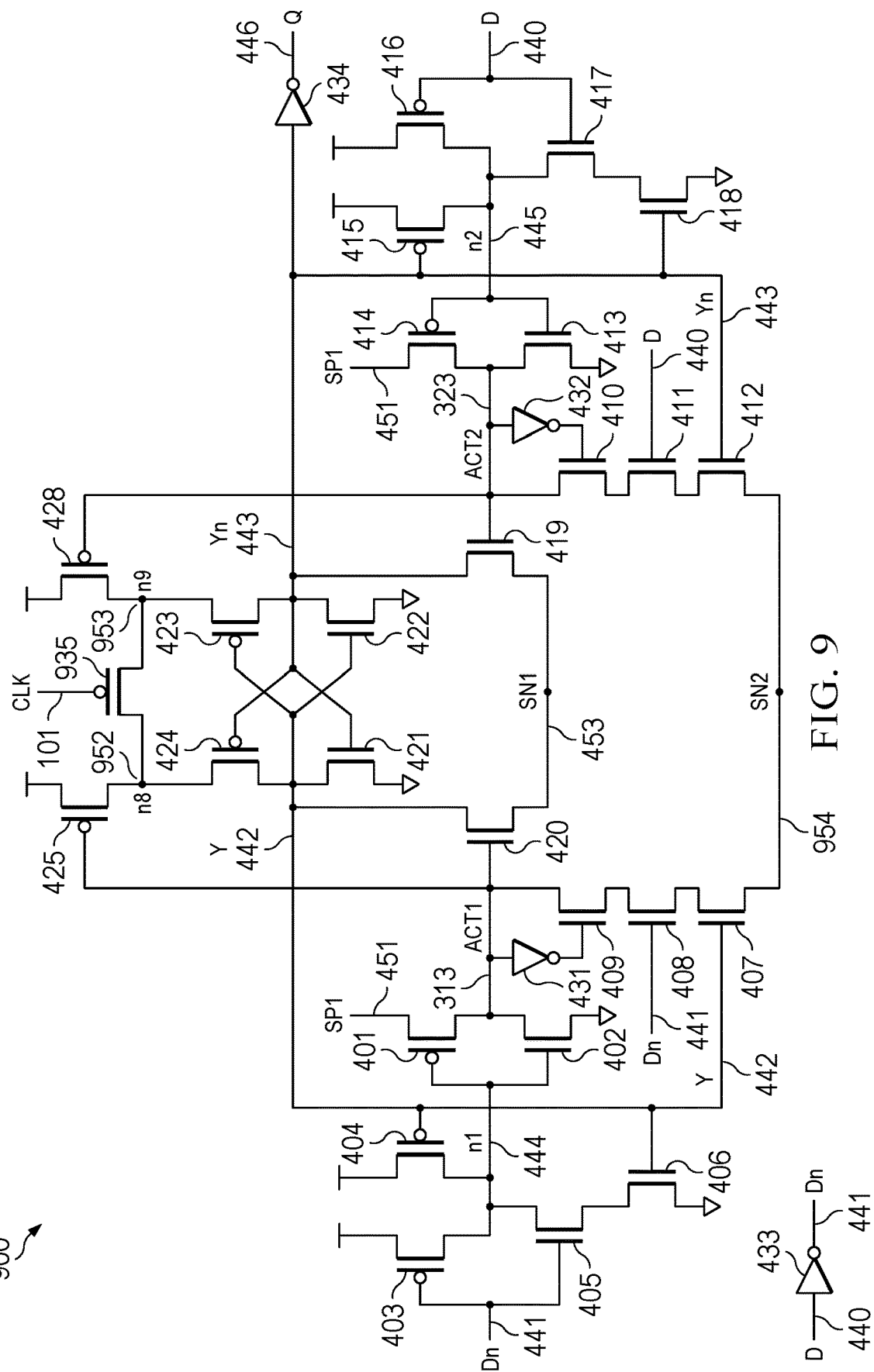
FIG. 9 is a circuit diagram illustrating another flip-flop circuit of FIG. 3 of the compound sequential circuit architecture of FIG. 1, according to an illustrative implementation.

Referring to FIG. 9, a circuit diagram illustrating another flip-flop circuit 900 of FIG. 3 of the compound sequential circuit architecture 100 of FIG. 1, according to an illustrative implementation. In some implementations, flip-flop circuit 900 illustrates an architecture in which the first keeper sub-circuit 312 and second keeper sub-circuit 322 are electrically coupled to a fourth clock terminal SN2 954. The first differential sub-circuit and second differential sub-circuit of latch 330 are electrically coupled still to the third clock terminal SN1 453. The first and second keeper sub-circuits are electrically decoupled from the first and second differential sub-circuits of latch 330. The fourth terminal SN2 954 is electrically coupled to a fourth shared clock node of the N-bit array. Now the amount of capacitance at either third shared clock node 133 or fourth shared clock node is 2N. Furthermore, the third keeper sub-circuit includes of only transistor 935. The gate terminal of transistor 935 is electrically coupled to the main clock signal 101. The drain terminal of transistor 935 is electrically coupled to the drain terminal of transistor 425, and the source terminal of transistor 935 is electrically coupled to the drain terminal of transistor 428. In this configuration, the main clock signal 101 is made available to flip-flop circuit 900 in order to maintain three shared clock nodes. The fourth clock terminal SN2 954 replaces the second clock terminal SP2 452, and the fourth shared clock node replaces the second shared clock node 132. A fourth clock-activated transistor replaces the second clock-activated transistor 112. In some implementations, the fourth clock-activated transistor can be an N-channel transistor. Since transistor 935 can be minimum size, it does not present much burden on the main clock signal 101. Transistor 935 functions as a shunt transistor to bridge nodes n8 952 and n9 953 when main clock signal 101 is at a first level. For example, if input signal D 440 transitions to a second level while main clock signal 101 is at a first level, signal ACT2 323 is asserted to deactivate transistor 428. Transistor 935 provides an alternative conductive path to high-power supply via transistors 423, 935, and 425 to maintain second output Yn 443 at a second level. The functionality and performance of flip-flop circuit 900 is similar to flip-flop circuit 400.

Figure 10:
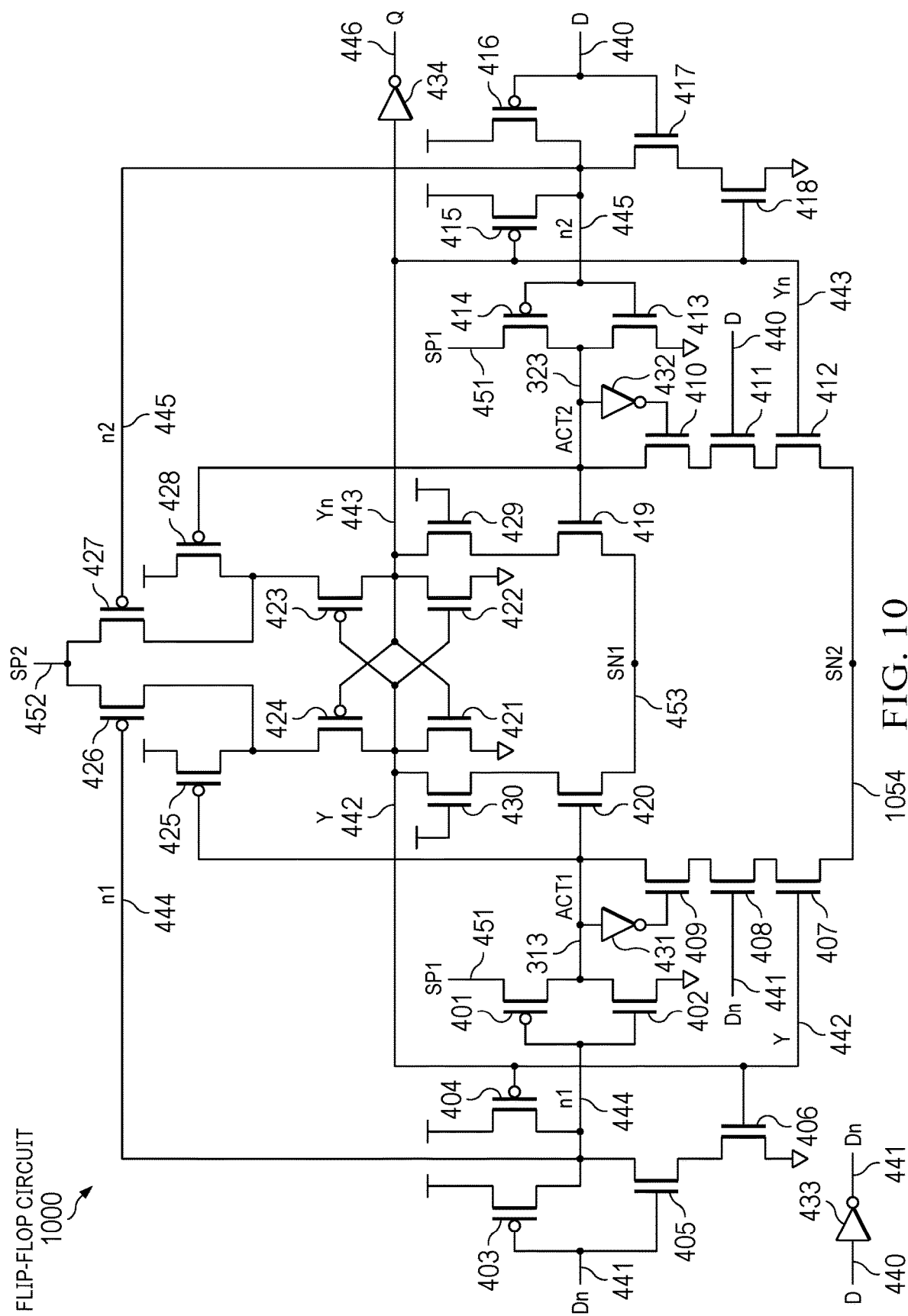
FIG. 10 is a circuit diagram illustrating another flip-flop circuit of FIG. 3 of the compound sequential circuit architecture of FIG. 1, according to an illustrative implementation.

Referring to FIG. 10, a circuit diagram illustrating another flip-flop circuit 1000 of FIG. 3 of the compound sequential circuit architecture 100 of FIG. 1, according to an illustrative implementation. The capacitance at third clock terminal SN1 453 is reduced by decoupling the first and second keeper sub-circuits from the first and second differential sub-circuits of latch 330. The first and second differential sub-circuits are electrically coupled only to the third clock terminal SN1 453. The first and second keeper sub-circuits are electrically coupled to a fourth clock terminal SN2 1054. Flip-flop circuit 1000 includes four clock terminals and thus, the N-bit array has four shared clock nodes. Flip-flop circuit 1000 is identical to flip-flop circuit 400 except the former has additional fourth clock terminal SN2 1054 electrically coupled to a fourth shared clock node of the N-bit array. A fourth clock-activated transistor is electrically coupled to the fourth shared clock node. Now the third and fourth shared clock nodes each contains 2N amount of aggregate capacitance because only two transistors are electrically coupled to each clock terminal within each flip-flop. It should be noted that another embodiment of flip-flop circuit 1000 exists by electrically coupling the gate terminal of transistor 426 to the output of inverter 431 and also electrically coupling the gate terminal of transistor 427 to the output of inverter 432. This configuration is a hybrid implementation of flip-flop circuit 500 and flip-flop circuit 1000 with four clock terminals and four clock-activated transistors.

Figure 11:
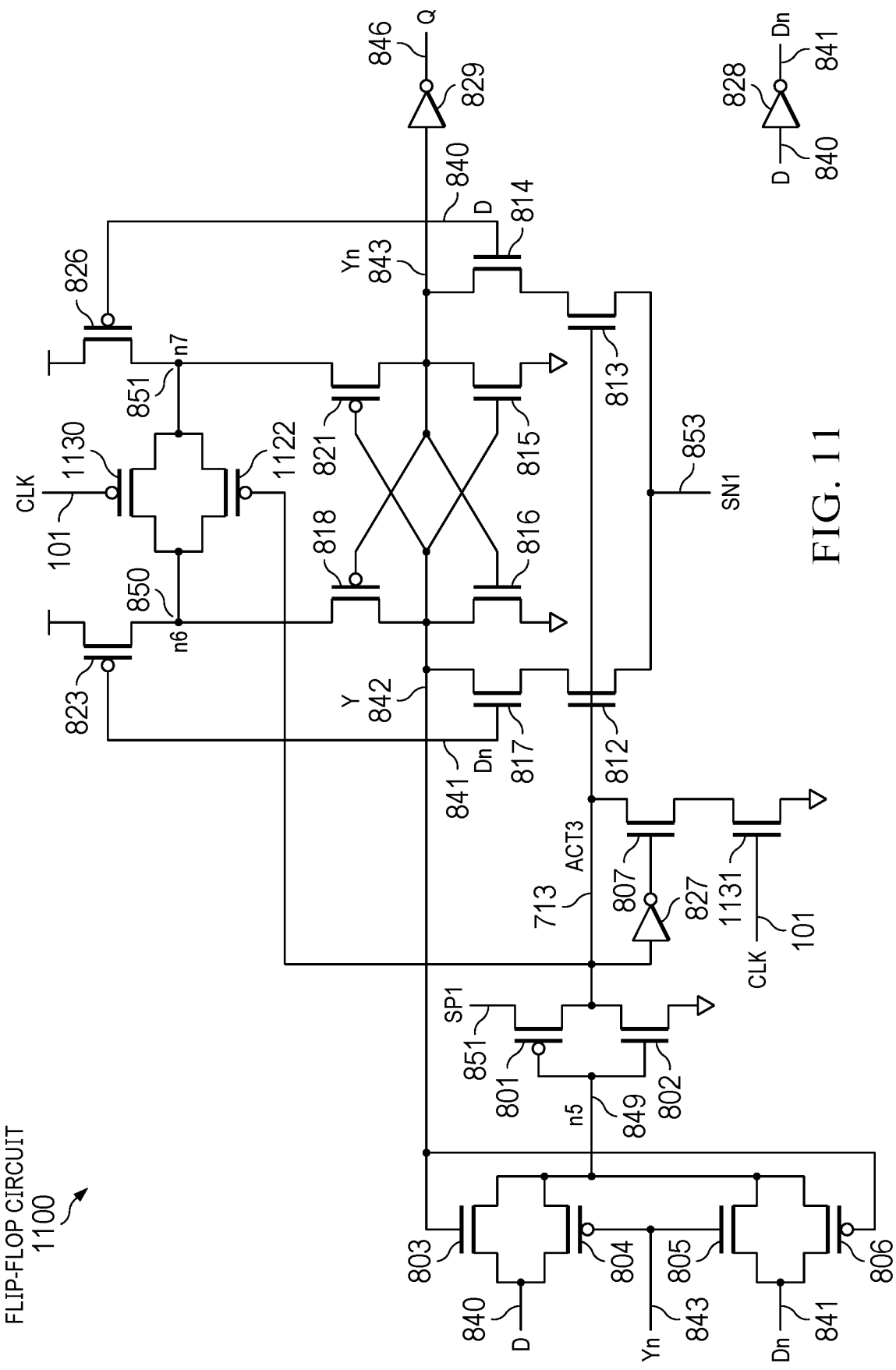
FIG. 11 is a circuit diagram illustrating another flip-flop circuit of FIG. 7 of the compound sequential circuit architecture of FIG. 1, according to an illustrative implementation.

Referring to FIG. 11, a circuit diagram illustrating another flip-flop circuit 1100 of FIG. 7 of the compound sequential circuit architecture 100 of FIG. 1, according to an illustrative implementation. Flip-flop circuit 1100 shows an implementation including only two clock terminals. Furthermore, only two shared clock nodes and two clock-activated transistors are present within the N-bit array. Unlike flip-flop circuit 800, flip-flop circuit 1100 can include two discrete clock-activated transistors 1130 and 1131. Only the first clock terminal SP1 851 and third clock terminal SN1 853 are implemented in this configuration as the second clock terminal SP2 852 has been replaced by shunt transistor 1130, which functions as the second keeper sub-circuit of latch 730. Shunt transistor 1130 is activated during main clock signal 101 at a first level such that the first output Y 842 or second output Yn 843 can be maintained at a second level should the input signal D 840 change. For example, if first output Y 842 is at a second level during clock at a first level, an alternative conductive path to high-power supply via transistors 818, 1130, and 826 is enabled to maintain first output Y 842 at a second level. Conversely if second output Yn 843 is at a second level during clock at a first level, an alternative conductive path to high-power supply via transistors 821, 1130 and 823 is enabled to maintain second output Yn 843 at a second level. A second shunt transistor 1122 is implemented in parallel with shunt transistor 1130 to function similarly as another keep sub-circuit should the input signal D 840 change while main clock signal 101 is at a second level. Shunt transistor 1122 also provides an alternative conductive path to high-power supply to maintain the first output Y 842 or second output Yn 843 at a second level while clock is at a second level. The gate terminal of transistor 1130 is electrically coupled to the main clock signal 101, and the gate terminal of transistor 1122 is electrically coupled to signal ACT3 713. The drain terminal of transistors 1130 and 1122 are electrically coupled to node n6 850, and the source terminals are electrically coupled to node n7 851. The third clock terminal SN1 853 is electrically coupled to only two transistors 812 and 813, which reduces the aggregate capacitance at the third shared clock node 133 when multiple flip-flops are electrically coupled within the N-bit array. The aggregate capacitance at the third shared clock node 133 has been reduced to 2N. The first keeper sub-circuit 712 includes inverter 827 and transistors 807 and 1131. The first keeper sub-circuit 712 is implemented with fewer transistors than the configuration of flip-flop circuit 800 and operates in a similar manner to maintain signal ACT3 713 at a first level while main clock signal 101 is at a second level. Since the first keeper sub-circuit 712 is clock-gated by clock-activated transistor 1131, it is activated in conjunction with the activation of transistor 802, and therefore does not depend on the input signal D 840 to change. Transistors 1130 and 1131 can be minimum size devices to present less of a burden on the main clock signal 101. The configuration of FIG. 11 can have fewer transistors than the configuration of FIG. 8, thereby occupying less silicon area and consuming less power.

Figure 12:
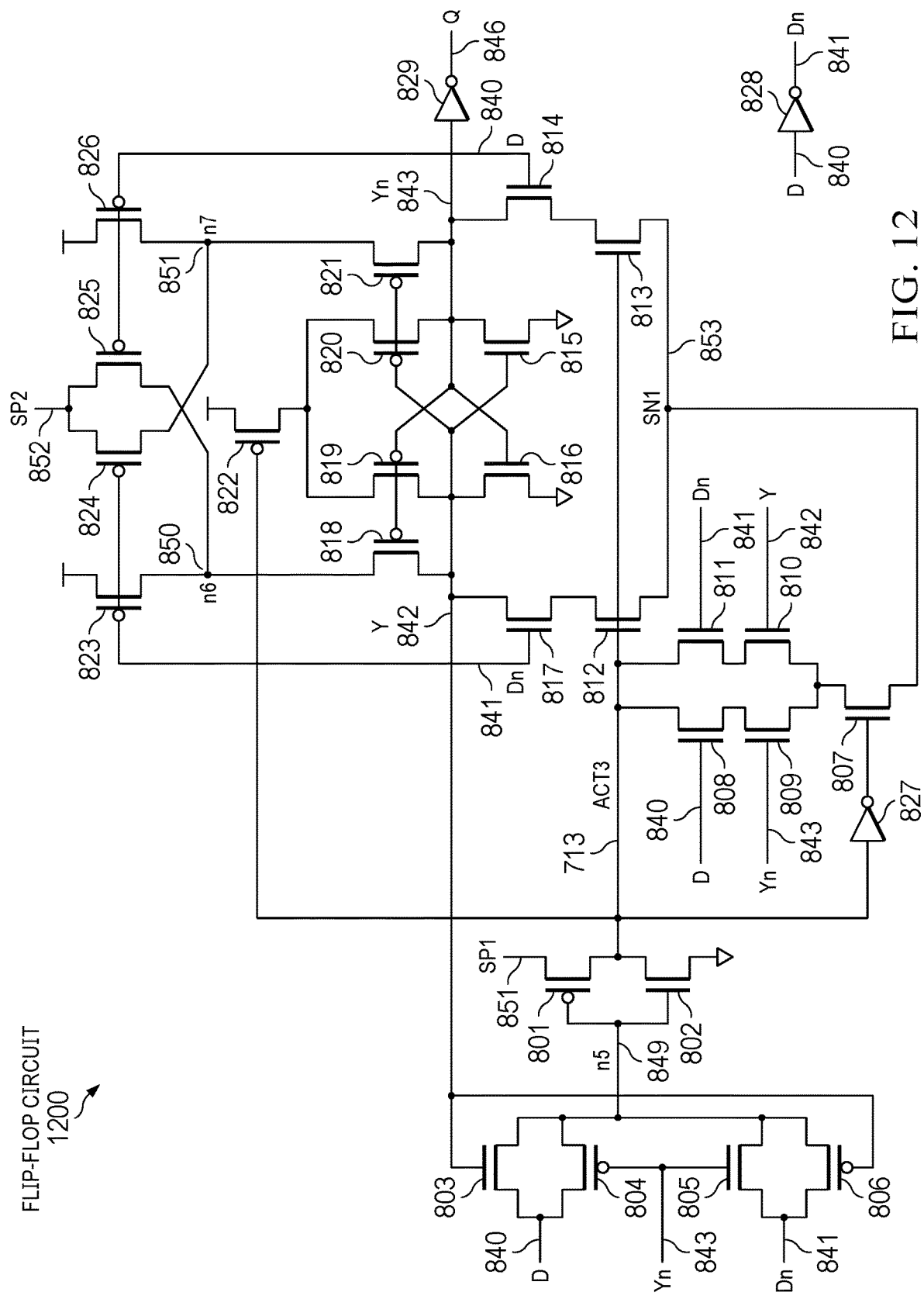
FIG. 12 is a circuit diagram illustrating another flip-flop circuit of FIG. 7 of the compound sequential circuit architecture of FIG. 1, according to an illustrative implementation.

Referring to FIG. 12, a circuit diagram illustrating another flip-flop circuit 1200 of FIG. 7 of the compound sequential circuit architecture 100 of FIG. 1, according to an illustrative implementation. In some implementations, to reduce the capacitance at the third shared clock node 133, FIG. 12 shows a configuration in which only three transistors are electrically coupled to the third clock terminal SN1 853. Referring to FIG. 8, inverter 827 and transistor 807 form an inverter feedback loop at the top-most position of the pull-down network within the first keeper sub-circuit 712. This inverter feedback loop including transistors 807 and inverter 827 also can be placed at the bottom-most position of the pull-down network as shown in FIG. 12. Thus, transistor 807 becomes the bottom-most transistor of the pull-down network, and the source terminal of transistor 807 is electrically coupled to the third clock terminal SN1 853. The drain terminals of transistors 808 and 811 are electrically coupled to signal ACT3 713, and the drain terminal of transistor 807 is electrically coupled to the source terminals of transistors 809 and 810. Placement of the inverter feedback loop at the bottom-most position removes one transistor electrically coupled to the third clock terminal SN1 853 while retaining the same functionality as FIG. 8. The aggregate capacitance at the third shared clock node 133 becomes 3N for this configuration when multiple flip-flops are electrically coupled together within an N-bit array.

Figure 13:
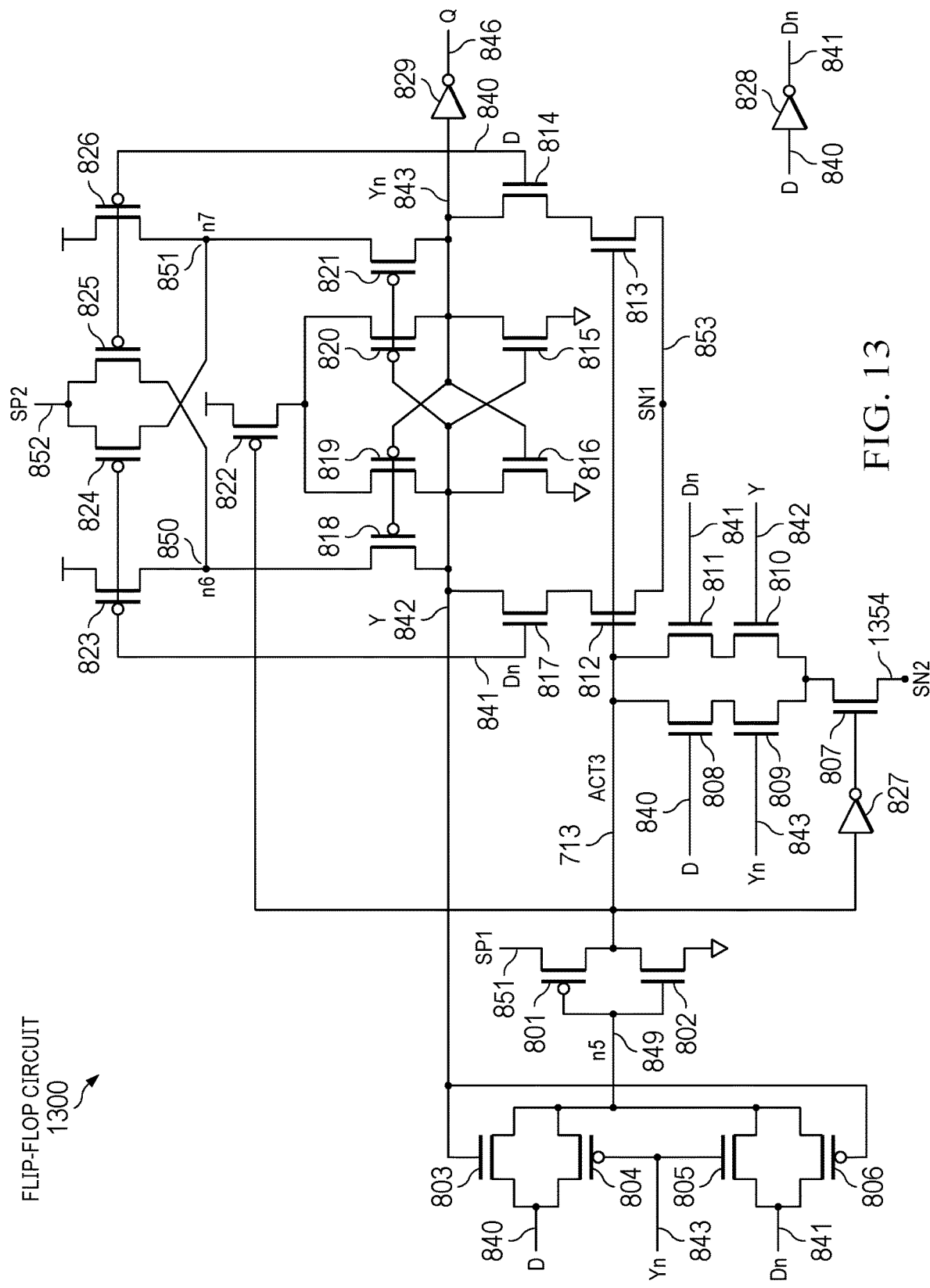
FIG. 13 is a circuit diagram illustrating another flip-flop circuit of FIG. 7 of the compound sequential circuit architecture of FIG. 1, according to an illustrative implementation.

Referring to FIG. 13, a circuit diagram illustrating another flip-flop circuit 1300 of FIG. 7 of the compound sequential circuit architecture 100 of FIG. 1, according to an illustrative implementation. In some implementations, the capacitance at third clock terminal SN1 853 is reduced by decoupling the first keeper sub-circuit 712 from the first and second differential sub-circuits of latch 730. The first and second differential sub-circuits are electrically coupled only to the third clock terminal SN1 853. The first keeper sub-circuit 712 is electrically coupled to a fourth clock terminal SN2 1354. Flip-flop circuit 1300 includes four clock terminals and thus, the N-bit array has four shared clock nodes. Flip-flop circuit 1300 is identical to flip-flop circuit 1200 of FIG. 12 except the former has an additional fourth clock terminal SN2 1354 electrically coupled to a fourth shared clock node of the N-bit array. A fourth clock-activated transistor is electrically coupled to the fourth shared clock node. Flip-flop circuit 1300 also retains the inverter feedback loop at the bottom-most position of the pull-down network of the first keeper sub-circuit 712. The source terminal of transistor 807 is electrically coupled to fourth clock terminal SN 1354, and thereby, only one transistor contributes capacitance to the fourth shared clock node of the N-bit array. Consequently, the fourth shared clock node has N aggregate capacitance while the third shared clock node has 2N aggregate capacitance.

Figure 14:
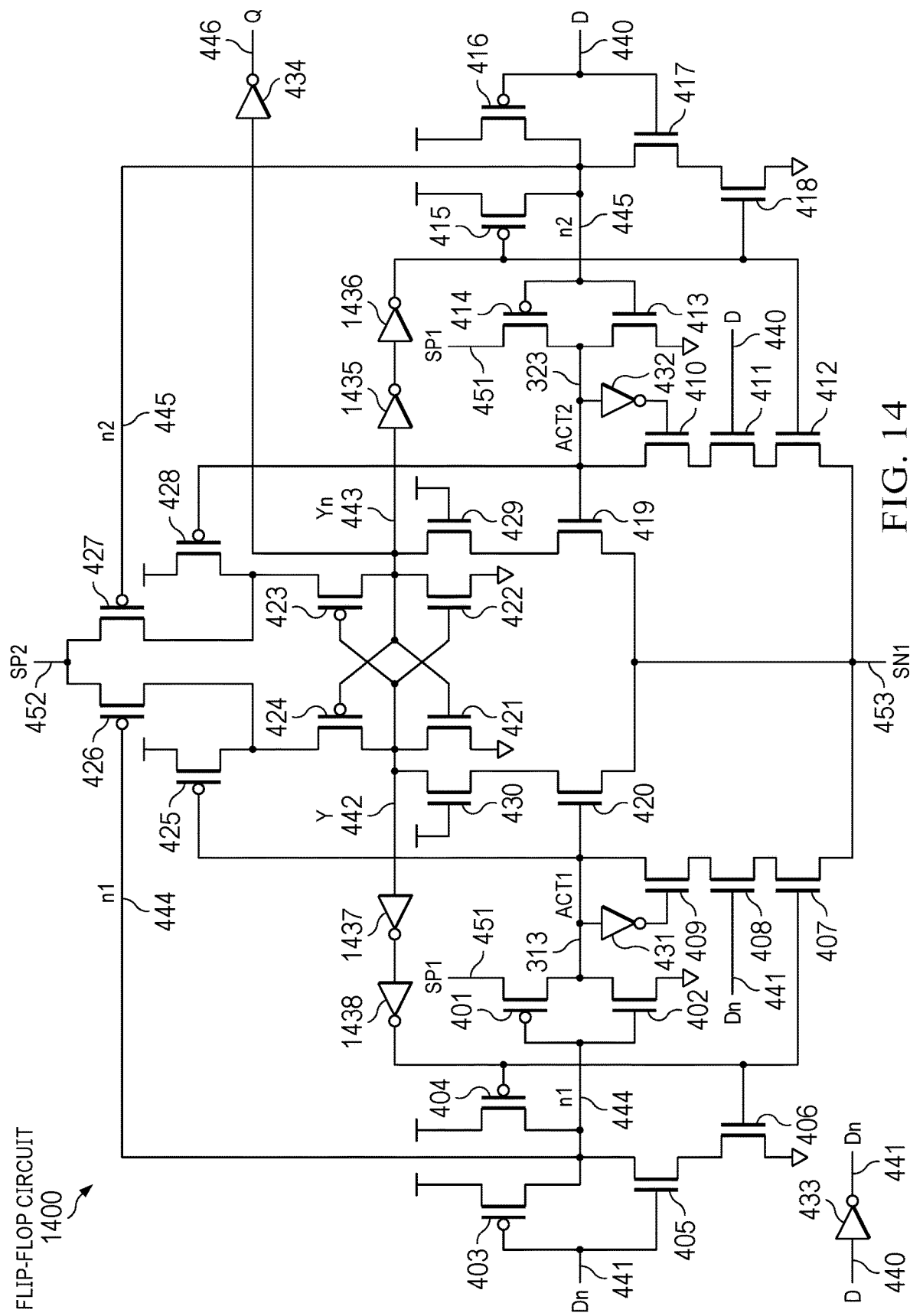
FIG. 14 is a circuit diagram illustrating another flip-flop circuit of FIG. 3 of the compound sequential circuit architecture of FIG. 1, according to an illustrative implementation.

Referring to FIG. 14, a circuit diagram illustrating another flip-flop circuit 1400 of FIG. 3 of the compound sequential circuit architecture 100 of FIG. 1, according to an illustrative implementation. In some implementations, flip-flop circuit 1400 includes a first delay element inserted between the first output Y 442 and the first sequence detector 310 and a second delay element inserted between the second output Yn 443 and the second sequence detector 320. The first delay element includes inverter chain 1437 and 1438, whereby the input of inverter 1437 is electrically coupled to the first output Y 442 and the output of inverter 1438 is electrically coupled to the gate terminals of transistors 404 and 406. A second delay element includes inverter chain 1435 and 1436, whereby the input of inverter 1435 is electrically coupled to the second output Yn 443 and the output of inverter 1436 is electrically coupled to the gate terminals of transistors 415 and 418. When signal ACT1 313 is enabled to activate first activation transistor 420 and main clock signal 101 transitions to a second level, first output Y 442 discharges to a first level. The discharging of first output Y 442 triggers a chain effect whereby transistor 404 is activated to charge node n1 444 to a second level, which in turn activates transistor 402 to disable signal ACT1 313. This feedback behavior may deactivate transistor 420 before first output Y 442 fully discharges to a first level. Due to the high capacitance at third clock terminal SN1 453, the discharge waveform of first output Y 442 may have a large slew rate, and the discharging of first output Y 442 may be halted. Normally if this occurs, transistor 421 completes the discharge of first output Y 442. Due to process variation, the threshold to activate transistor 421 may not be met; therefore, a delay element including two series-coupled inverters can be inserted between the first output Y 442 and first sequence detector 310 to allow sufficient time for first output Y 442 to fully discharge. Similar discussion can justify the insertion of a delay element between second output Yn 443 and second sequence detector 320. It should be noted that the insertion of delay elements to allow first and second outputs to fully discharge is applicable to all embodiments with the circuit architecture of flip-flop circuit 400.

Figure 15:
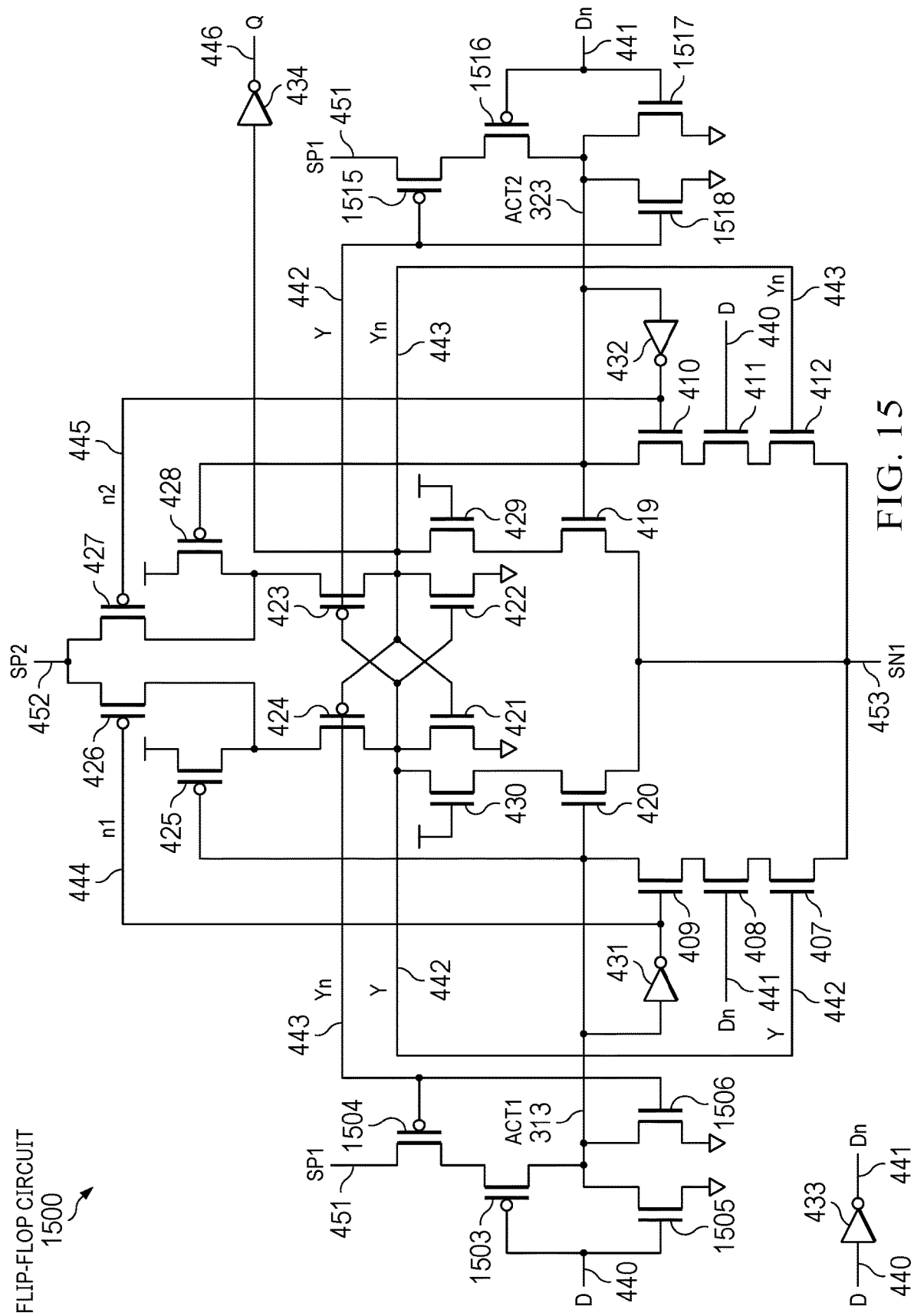
FIG. 15 is a circuit diagram illustrating another flip-flop circuit of FIG. 3 of the compound sequential circuit architecture of FIG. 1, according to an illustrative implementation.

Referring to FIG. 15, a circuit diagram illustrating another flip-flop circuit 1500 of FIG. 3 of the compound sequential circuit architecture 100 of FIG. 1, according to an illustrative implementation. In some implementations, the first and sequence detectors are implemented using a different logic gate which combines both sequence detector and buffer into a single logic gate. This configuration reduces the total transistor count but introduces three series-coupled P-channel transistors into a timing path of flip-flop circuit 1500. There are two P-channel transistors from the logic gate and the first clock-activated transistor 111 which include the pull-up network to enable signal ACT1 313 or ACT2 323. The first sequence detector 310 includes transistors 1503, 1504, 1505, and 1506 while the second sequence detector 320 includes transistors 1515, 1516, 1517, and 1518. Input signal D 440 is electrically coupled to the gate terminals of transistors 1503 and 1505, and second output Yn 443 is electrically coupled to the gate terminals of transistors 1504 and 1506. In this manner, the first sequence detector 310 receives input signal D 440 and second output Yn 443. Likewise, the second sequence detector 320 receives inverted input signal Dn 441 and first output Y 442. Inverted input signal Dn 441 is electrically coupled to the gate terminals of transistors 1516 and 1517, and first output Y 442 is electrically coupled to the gate terminals of transistors 1515 and 1518. The inputs to the first and second keeper sub-circuits remain the same from FIG. 4. In the configuration of FIG. 15, the first sequence detector 310 has the complement logic polarity as the inputs of the first keeper sub-circuit 312. Likewise, the second sequence detector 320 has the complement logic polarity as the inputs of the second keeper sub-circuit 322. The output of each logic gate including the first and second sequence detectors drives signal ACT1 313 and ACT2 323, respectively, thereby eliminating the need for a buffer circuit. The third keeper sub-circuit is electrically coupled to the first and second keeper sub-circuits in the same manner as FIG. 5.

Figure 16:
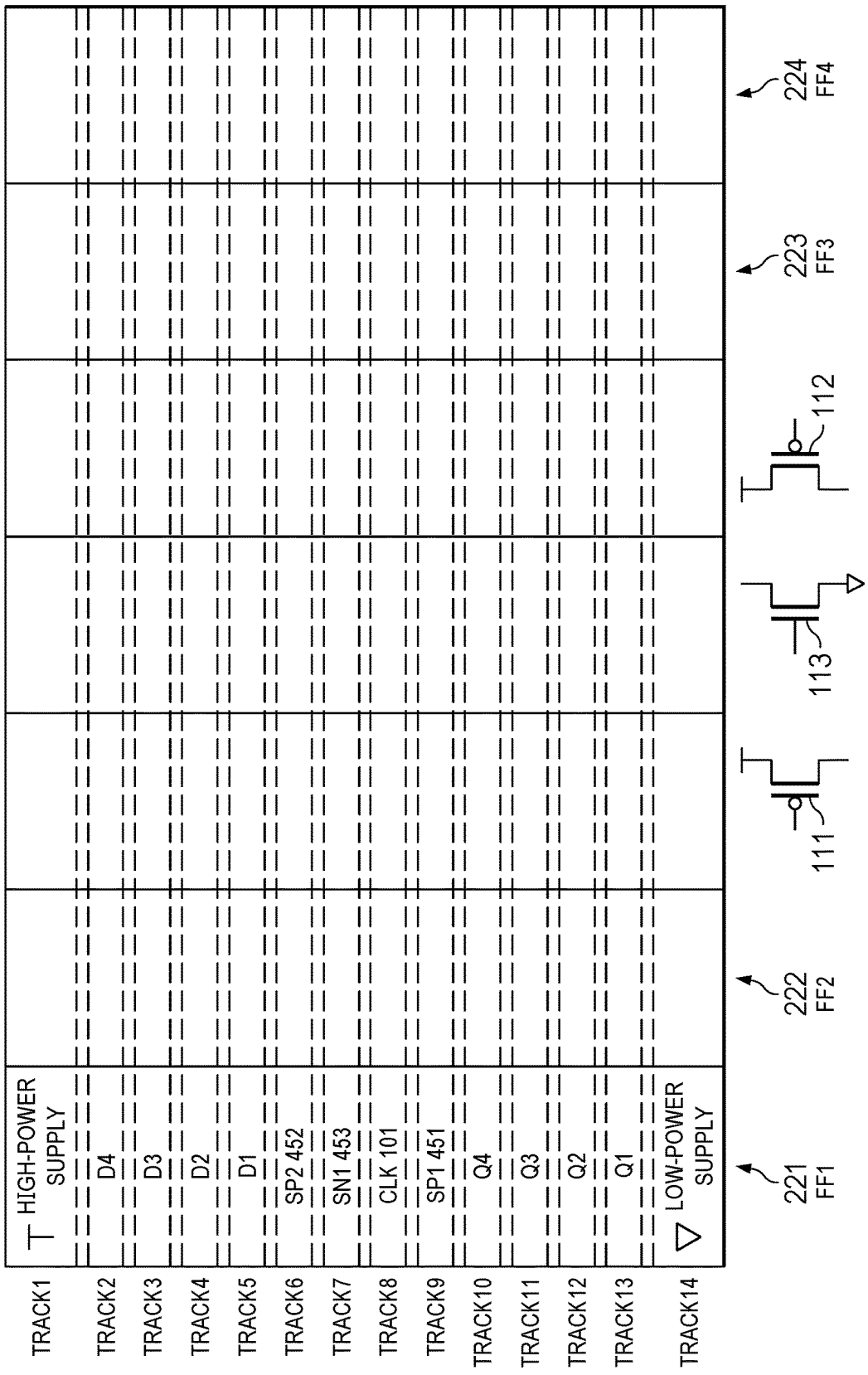
FIG. 16 is a block diagram illustrating a cell placement diagram of the compound sequential circuit architecture of FIG. 1, according to an illustrative implementation.

Referring to FIG. 16, a block diagram illustrating a cell placement diagram 1600 of the compound sequential circuit architecture 100 of FIG. 1, according to an illustrative implementation. In some implementations, FIG. 16 illustrates how multiple flip-flops within an N-bit array can be arranged to create a "mega" cell for use in a standard cell library as part of an ASIC design flow. This placement diagram includes four flip-flops based on the 4-bit compound sequential circuit 220 of FIG. 2. The three clock-activated transistors 111-113 are positioned in the middle of the "mega" cell with two flip-flops FF1 221 and FF2 222 to the left and two flip-flops FF3 223 and FF4 224 to the right. This arrangement provides symmetry and balance to distribute the routing and interconnects of the main clock signal 101 and the shared clock nodes. A metal strip for high-power supply VDD and another metal strip for low-power supply GND are situated at the top track 1 and bottom track 14, respectively. Tracks 2-5 for the input signals D4 to D1 are below high-power supply while tracks 10-13 for the output signals Q4 to Q1 are above low-power supply. In between the input signal group and output signal group is the clock signal group: SP2 452, SN1 453, clk 101, and SP1 451 at tracks 6-9. As FIG. 16 is an illustrative example of a 4-bit array, larger or smaller bit arrays can be implemented with this methodology for sharing clock nodes and clock-activated transistors.

Figure 17:
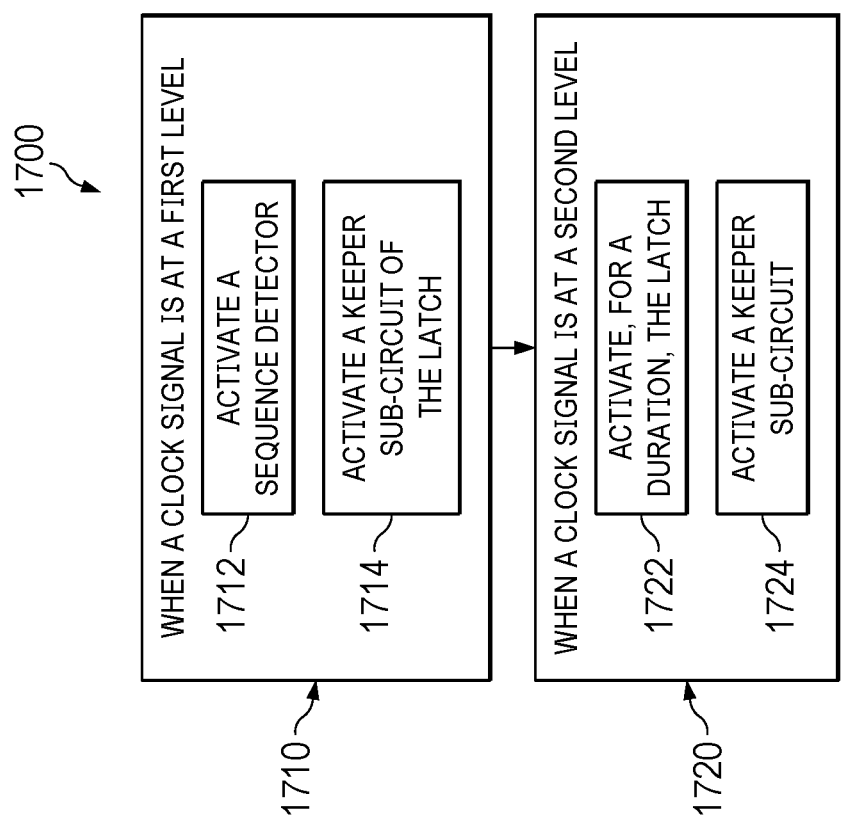
FIG. 17 is a flowchart for a method of generating data outputs based on sampled data inputs, according to an illustrative implementation.

Referring to FIG. 17, a flowchart for a method 1700 of generating data outputs based on sampled data inputs, according to an illustrative implementation. Circuit architecture 100, flip-flop circuit 400, and flip-flop circuit 800 (or any other circuit described herein) can be configured to perform method 1700. Further, any clock-activated transistor architecture (e.g., 100-1500) described herein can be configured to perform method 1700.

In broad overview of method 1700, at block 1710, when a clock signal is at a first level, a sequence detector is activated (1712) and a keeper sub-circuit of the latch is activated (1714). At block 1720, when a clock signal is at a second level, a latch, for a duration, can be activated (1722) and a keeper sub-circuit can be activated (1724). Additional, fewer, or different operations may be performed depending on the particular implementation. In some implementations, each operation may be re-ordered, added, removed, or repeated.

In general, method 1700 includes an N-bit array of flip-flops electrically coupled to a plurality of shared clock nodes. Each flip-flop within the N-bit array includes a buffer, a latch with first and second differential sub-circuits (e.g., FIG. 4) and a keeper sub-circuit. In some implementations, when the first differential sub-circuit is enabled, the second differential sub-circuit is disabled and the keeper sub-circuit is deactivated. When the second differential sub-circuit is enabled, the first differential sub-circuit is disabled and the keeper sub-circuit is deactivated. When the keeper sub-circuit is activated, the first and second differential sub-circuits are disabled and a pull-down transistor of the buffer is deactivated. In some implementations, the keeper sub-circuit is active while the main clock signal is at second level. In some implementations, the buffer, latch, and keeper sub-circuit are electrically coupled to the plurality of shared clock nodes.

Referring to method 1700 in more detail, at block 1712, when a clock signal is at a first level and in response to a first change in an input signal that is an opposite logic polarity compared to an output of a latch, sequence detector is activated, wherein the sequence detector activates a differential sub-circuit of a latch. At block 1714, when a clock signal is at a first level and in response to a first change in an input signal that is an opposite logic polarity compared to an output of a latch, a keeper sub-circuit of the latch can be activated.

In some implementations, at block 1720 and with reference to FIG. 4 a first sequence detector is activated to activate a first differential sub-circuit of a first latch when an input signal is at first level and an output signal is at second level. In some implementations, a second sequence detector is activated to activate a second differential sub-circuit of the first latch when the input signal is at second level and the output signal is at first level. In particular, if the first sequence detector is activated, the second sequence detector is deactivated and if the second sequence detector is activated, the first sequence detector is deactivated. In some implementations, at block 1720 a keeper sub-circuit (e.g., transistors 426/427) of the first latch is activated when the input signal is of opposite logic polarity than the output signal (e.g., FIG. 4). In some implementations, at block 1720 and with reference to FIG. 8 a sequence detector is activated to activate a first transistor and a second transistor of a second latch when the input signal is of opposite logic polarity than the output signal. In some implementations, a first keeper sub-circuit (FIG. 4), a second keeper sub-circuit (FIG. 4), and a keeper sub-circuit (FIG. 8) are deactivated.

At block 1722, when the clock signal is at a second level, a latch, for a duration can be activated, and deactivate the latch when the output of latch becomes a same level as the input signal, wherein the duration starts when the clock signal goes to the second level and the duration ends when the output of latch becomes the same level as the input signal. At block 1724, when the clock signal is at a second level and in response to a second change in the input signal that is the opposite logic polarity compared to the output of the latch, a keeper sub-circuit is activated.

In some implementations, at block 1720 one or more sequence detectors (e.g., FIG. 4 (two sequence detectors) and FIG. 8 (one sequence detector)) can be deactivated. In some implementations, if the first or second differential sub-circuit of the first latch is activated, the first latch is activated and becomes deactivated after the output signal settles to new level. For example, when the first latch becomes deactivated, the first and second differential sub-circuits are deactivated. In some implementations, if the first and second transistors of the second latch are activated, the second latch is activated and becomes deactivated after the output signal settles to new level. For example, when the second latch becomes deactivated, the first and second transistors are deactivated. In some implementations, if the input signal changes to a level different than the output signal, either the first keeper sub-circuit or second keeper sub-circuit (e.g., FIG. 4) is activated. In particular, if the first keeper sub-circuit is activated, the first differential sub-circuit, the second differential sub-circuit, and the second keeper sub-circuit are deactivated (e.g., FIG. 4). Furthermore, if the second keeper sub-circuit is activated, the first differential sub-circuit, the second differential sub-circuit, and the first keeper sub-circuit are deactivated (e.g., FIG. 4). In some implementations, if the input signal changes to a level different than the output signal, a keeper sub-circuit is activated (e.g., FIG. 8 and as compared to the two keeper sub-circuits of FIG. 4)

While this specification contains many specific implementation details, these should not be construed as limitations on the scope of any inventions or of what may be claimed, but rather as descriptions of features specific to particular implementations of the systems and methods described herein. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In some cases, the actions recited in the claims can be performed in a different order and still achieve desirable results. In addition, the processes depicted in the accompanying figures do not necessarily require the particular order shown, or sequential order, to achieve desirable results.

Having now described some illustrative implementations it is apparent that the foregoing is illustrative and not limiting, having been presented by way of example. In particular, although many of the examples presented herein involve specific combinations of method acts or system elements or components, those acts, and those elements may be combined in other ways to accomplish the same objectives. Acts, elements and features discussed only in connection with one implementation are not intended to be excluded from a similar role in other implementations.

The phraseology and terminology used herein is for the purpose of description and should not be regarded as limiting. The use of "including" "comprising" "having" "containing" "involving" "characterized by" "characterized in that" and variations thereof herein, is meant to encompass the components items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements or components, and any references in plural to any implementation, arrangement, or element or act herein may also embrace implementations including only a single element or component. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. Although the examples provided herein relate to systems (e.g., circuits) and methods for generating data outputs utilizing shared clock-activated transistors, the systems and methods described herein can be applied to other circuits and methods. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A compound sequential circuit comprising:
 a first clock-activated transistor electrically coupled to a first shared clock node;
 a second clock-activated transistor coupled to a second shared clock node;
 a third clock-activated transistor coupled to a third shared clock node;
 a plurality of flip-flops, wherein each flip-flop of the plurality of flip-flops comprise:
 a latch electrically coupled to the second shared clock node and the third shared clock node; and
 a first keeper sub-circuit electrically coupled to the third shared clock node and at least one of a first output or a second output of the latch.

2. The compound sequential circuit of claim 1, wherein each flip-flop of the plurality of flip-flops further comprises:
 a first buffer electrically coupled to the first shared clock node;
 a second buffer electrically coupled to the first shared clock node;
 a second keeper sub-circuit electrically coupled to the third shared clock node and the second output of the latch, wherein first keeper sub-circuit is electrically coupled to the first output of the latch; and
 wherein the first keeper sub-circuit is gated by the first output of the latch and an inverted input signal, and wherein the second keeper sub-circuit is gated by the second output of the latch and an input signal.

3. The compound sequential circuit of claim 2, wherein each flip-flop of the plurality of flip-flops further comprises:
 a first sequence detector comprising the first buffer and electrically couples to the first output of the latch and to the inverted input signal, wherein the first sequence detector configured to activate a first differential sub-circuit of the latch in response to:
 (1) the first output of the latch being at a second level,
 (2) the input signal being at a first level, and
 (3) a main clock signal being at the first level;
 wherein the first differential sub-circuit of the latch is deactivated when the main clock signal is at the second level;
 a second sequence detector comprising the second buffer and electrically couples to the second output of the latch and to the input signal, wherein the second sequence detector configured to activate a second differential sub-circuit of the latch in response to:
 (1) the first output of the latch being at a first level,
 (2) the input signal being at a second level, and
 (3) a main clock signal being at the first level;
 wherein the second differential sub-circuit of the latch is deactivated when the main clock signal is at the second level;
 wherein the first differential sub-circuit of the latch and second differential sub-circuit of the latch are electrically coupled to the third shared clock node; and
 wherein the inputs of the first keeper sub-circuit have the same logic polarities compared to the inputs of the first sequence detector, and wherein the inputs of the second keeper sub-circuit have the same logic polarities compared to the inputs of the second sequence detector.

4. The compound sequential circuit of claim 3, wherein the first keeper sub-circuit is activated in response to:
 (1) the first output of the latch being at the second level,
 (2) the input signal being at the first level, and
 (3) a main clock signal being at the second level;
 wherein the second keeper sub-circuit is activated in response to:
 (1) the first output of the latch being at the first level,
 (2) the input signal being at the second level, and
 (3) a main clock signal being at the second level;
 wherein both the first keeper sub-circuit and the first sequence detector receive the inverted input signal and the first output of the latch as inputs, wherein both the second keeper sub-circuit and the second sequence detector receive the input signal and the second output of the latch as inputs.

5. The compound sequential circuit of claim 3, wherein each flip-flop of the plurality of flip-flops comprises a plurality of electrical relationship:
 wherein a first electrical relationship of the plurality of electrical relationships is when the first differential sub-circuit is activated, the second differential sub-circuit is deactivated, the first keeper sub-circuit is deactivated, and the second keeper sub-circuit is deactivated;
 wherein a second electrical relationship of the plurality of electrical relationships is when the second differential sub-circuit is activated, the first differential sub-circuit is deactivated, the first keeper sub-circuit is deactivated, and the second keeper sub-circuit is deactivated;
 wherein a third electrical relationship of the plurality of electrical relationships is when the first keeper sub-circuit is activated, the second keeper sub-circuit is deactivated, the first differential sub-circuit is deactivated, the second differential sub-circuit is deactivated, and a first pull-down transistor of the first buffer is deactivated;
 wherein a fourth electrical relationship of the plurality of electrical relationships is when the second keeper sub-circuit is activated, the first keeper sub-circuit is deactivated, the first differential sub-circuit is deactivated, and the second differential sub-circuit is deactivated, and a second pull-down transistor of the second buffer is deactivated;
 wherein a fifth electrical relationship of the plurality of electrical relationships is when the first differential sub-circuit of the latch is activated when the main clock signal is at the first level, and when the second differential sub-circuit of the latch is activated when the main clock signal is at the first level;
 wherein a sixth electrical relationship of the plurality of electrical relationships is when the first keeper sub-circuit is activated when the main clock signal is at the second level, and when the second keeper sub-circuit is activated only when the main clock signal is at the second level; and wherein a seventh electrical relationship of the plurality of electrical relationships is when the second output of the latch is the inverted polarity of the first output of the latch.

6. The compound sequential circuit of claim 3, wherein the first differential sub-circuit of the latch comprises a first reduction transistor configured to reduce a first charge sharing between the first output of the latch and the third shared clock node, and wherein the second differential sub-circuit of the latch comprises a second reduction transistor configured to reduce a second charge sharing between the second output of the latch and the third shared clock node, and wherein each flip-flop of the plurality of flip-flops further comprises:
  a first delay electrical element positioned between the first output of the latch and the first sequence detector; and
  a second delay electrical element positioned between the second output of the latch and the second sequence detector.

7. The compound sequential circuit of claim 3, wherein the latch further comprises:
  a third keeper sub-circuit electrically coupled to the first sequence detector and the second sequence detector, wherein the third keeper sub-circuit is activated when the input signal is different than the first output of the latch and deactivated when the input signal is at same level as the first output of the latch, wherein the third keeper sub-circuit is electrically coupled to the second shared clock node, and wherein the third keeper sub-circuit is further electrically coupled to the first keeper sub-circuit and the second keeper sub-circuit.

8. The compound sequential circuit of claim 1, wherein the plurality of flip-flops are electrically coupled to at most three clock-activated transistors, and wherein each source terminal of the first clock-activated transistor, the second clock-activated transistor, and the third clock-activated transistor is electrically coupled to at least one of a high-power supply or a low-power supply.

9. The compound sequential circuit of claim 1, wherein each flip-flop of the plurality of flip-flops further comprises:
  a first buffer electrically coupled to the first shared clock node;
  a first sequence detector comprising the first buffer and electrically couples to the first output of the latch, the second output of the latch, an input signal, and an inverted input signal, wherein the first sequence detector configured to activate a first transistor and a second transistor in response to:
  (1) the input signal is the opposite logic polarity compared to the first output of the latch when a main clock signal is at a first level,
  (2) the first transistor and the second transistor are deactivated when the main clock signal is at a second level;
  wherein activating the first transistor and the second transistor when the main clock signal is at the first level activates the latch to capture a data bit from the input signal and to generate an output signal based on a level of the captured data bit when the main clock signal transitions from the first level to the second level.

10. The compound sequential circuit of claim 9, wherein the first keeper sub-circuit is activated in response to a change in the input signal that is the opposite logic polarity compared to the first output of the latch when a main clock signal is at a second level, and wherein when the first keeper sub-circuit is activated, a pull-down transistor of the first buffer is deactivated, the first transistor is deactivated and the second transistor is deactivated.

11. The compound sequential circuit of claim 9, wherein the first keeper sub-circuit is configured to receive, as inputs, the first output of the latch, the second output of the latch, the input signal, and the inverted input signal, and wherein the latch further comprises:
  at least a first intermediate node and a second intermediate node; and
  at least the first transistor and the second transistor configured to be activated simultaneously by the output of the first buffer, and wherein the first transistor and the second transistor are electrically coupled to the third shared clock node.

12. The compound sequential circuit of claim 9, wherein the first keeper sub-circuit comprises an inverter feedback loop at a bottom-most position of a pull-down network, wherein the pull-down network comprises a third transistor, a fourth transistor, a fifth transistor, a sixth transistor and the inverter feedback loop, and wherein inverter feedback loop comprises an inverter and a seventh transistor, and wherein the seventh transistor of the inverter feedback loop is electrically coupled to the third shared clocked node.

13. The compound sequential circuit of claim 1, wherein the latch further comprises:
  a second keeper sub-circuit electrically coupled to an input signal and an inverted input signal, wherein the second keeper sub-circuit is activated in response to:
  a change in the input signal when a main clock signal being at a first level;
  wherein the second keeper sub-circuit is electrically coupled to the second shared clock node, and wherein the second keeper sub-circuit is electrically cross-coupled to a first intermediate node of the latch and a second intermediate node of the latch.

14. A compound sequential circuit comprising:
  a first clock-activated transistor electrically coupled to a first shared clock node;
  a second clock-activated transistor coupled to a second shared clock node;
  a third clock-activated transistor coupled to a third shared clock node;
  a plurality of flip-flops, wherein each flip-flop of the plurality of flip-flops comprise:
  a latch electrically coupled to the second shared clock node and the third shared clock node;
  a first buffer electrically coupled to the first shared clock node;
  a second buffer electrically coupled to the first shared clock node;
  a first keeper sub-circuit electrically coupled to the third shared clock node and at least one of a first output or a second output of the latch;
  a second keeper sub-circuit electrically coupled to the third shared clock node and the second output of the latch, wherein first keeper sub-circuit is electrically coupled to the first output of the latch;
  a first sequence detector comprising the first buffer and electrically couples to the first output of the latch and to an inverted input signal;
  a second sequence detector comprising the second buffer and electrically couples to the second output of the latch and to an input signal; and
  wherein the first keeper sub-circuit is gated by the first output of the latch and the inverted input signal, and wherein the second keeper sub-circuit is gated by the second output of the latch and the input signal.

15. The compound sequential circuit of claim 14,
wherein the first sequence detector configured to activate a first differential sub-circuit of the latch in response to:
(1) the first output of the latch being at a second level,
(2) the input signal being at a first level, and
(3) a main clock signal being at the first level;
wherein the first differential sub-circuit of the latch is deactivated when the main clock signal is at the second level;
wherein the second sequence detector configured to activate a second differential sub-circuit of the latch in response to:
(1) the first output of the latch being at a first level,
(2) the input signal being at a second level, and
(3) a main clock signal being at the first level;
wherein the second differential sub-circuit of the latch is deactivated when the main clock signal is at the second level;
wherein the first differential sub-circuit of the latch and second differential sub-circuit of the latch are electrically coupled to the third shared clock node; and
wherein the inputs of the first keeper sub-circuit have the same logic polarities compared to the inputs of the first sequence detector, and wherein the inputs of the second keeper sub-circuit have the same logic polarities compared to the inputs of the second sequence detector.

16. The compound sequential circuit of claim 15, wherein the first keeper sub-circuit is activated in response to:
(1) the first output of the latch being at the second level,
(2) the input signal being at the first level, and
(3) a main clock signal being at the second level;
wherein the second keeper sub-circuit is activated in response to:
(1) the first output of the latch being at the first level,
(2) the input signal being at the second level, and
(3) a main clock signal being at the second level;
wherein both the first keeper sub-circuit and the first sequence detector receive the inverted input signal and the first output of the latch as inputs, wherein both the second keeper sub-circuit and the second sequence detector receive the input signal and the second output of the latch as inputs.

17. The compound sequential circuit of claim 15, wherein the first differential sub-circuit of the latch comprises a first reduction transistor configured to reduce a first charge sharing between the first output of the latch and the third shared clock node, and wherein the second differential sub-circuit of the latch comprises a second reduction transistor configured to reduce a second charge sharing between the second output of the latch and the third shared clock node, and wherein each flip-flop of the plurality of flip-flops further comprises:

a first delay electrical element positioned between the first output of the latch and the first sequence detector;
a second delay electrical element positioned between the second output of the latch and the second sequence detector; and
wherein the latch further comprises:
a third keeper sub-circuit electrically coupled to the first sequence detector and the second sequence detector, wherein the third keeper sub-circuit is activated when the input signal is different than the first output of the latch and deactivated when the input signal is at same level as the first output of the latch, wherein the third keeper sub-circuit is electrically coupled to the second shared clock node, and wherein the third keeper sub-circuit is further electrically coupled to the first keeper sub-circuit and the second keeper sub-circuit.

18. The compound sequential circuit of claim 14, wherein the plurality of flip-flops are electrically coupled to at most three clock-activated transistors, and wherein each source terminal of the first clock-activated transistor, the second clock-activated transistor, and the third clock-activated transistor is electrically coupled to at least one of a high-power supply or a low-power supply.

19. A method for generating data outputs for a plurality of flip-flops based on sampled data inputs, the method comprising:
when a clock signal is at a first level and in response to a first change in an input signal that is an opposite logic polarity compared to an output of a latch:
activating a sequence detector, wherein the sequence detector activates a differential sub-circuit of a latch; and
activating a keeper sub-circuit of the latch;
when the clock signal is at a second level:
activating, for a duration, the latch, and deactivate the latch when the output of latch becomes a same level as the input signal, wherein the duration starts when the clock signal goes to the second level and the duration ends when the output of latch becomes the same level as the input signal;
in response to a second change in the input signal that is the opposite logic polarity compared to the output of the latch, activating a keeper sub-circuit.

20. The method of claim 11, wherein the plurality of flip-flops are electrically coupled to at most three clock-activated transistors, and wherein each source terminal of a first clock-activated transistor, a second clock-activated transistor, and a third clock-activated transistor is electrically coupled to at least one of a high-power supply or a low-power supply.

* * * * *